(12) United States Patent
Wang et al.

(10) Patent No.: US 11,808,789 B2
(45) Date of Patent: Nov. 7, 2023

(54) CURRENT DETECTING CIRCUIT, CURRENT DETECTING METHOD AND CONVERTER

(71) Applicant: Delta Electronics (Shanghai) Co., Ltd., Shanghai (CN)

(72) Inventors: Xiaolei Wang, Shanghai (CN); Peng Zhu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/811,306

(22) Filed: Jul. 8, 2022

(65) Prior Publication Data

US 2023/0028330 A1      Jan. 26, 2023

(30) Foreign Application Priority Data

Jul. 26, 2021   (CN) .......................... 202110842529.8

(51) Int. Cl.
  *G01R 15/18*   (2006.01)
  *G01R 19/00*   (2006.01)

(52) U.S. Cl.
  CPC ....... *G01R 15/186* (2013.01); *G01R 19/0092* (2013.01)

(58) Field of Classification Search
  CPC ...... G01R 15/186; G01R 15/18; G01R 15/16; G01R 19/0092; G01R 19/18; G01R 19/2509
  See application file for complete search history.

(56) References Cited

U.S. PATENT DOCUMENTS

2018/0351396 A1*   12/2018   Chen ................. H01M 10/0525

FOREIGN PATENT DOCUMENTS

| CN | 101286415 A | 10/2008 | |
|----|-------------|---------|---|
| CN | 108845181 A | 11/2018 | |
| CN | 208421060 U | 1/2019 | |
| CN | 106568998 B | 11/2019 | |
| CN | 111541368 A | 8/2020 | |
| CN | 112202330 A | 1/2021 | |
| EP | 3175677 B1 | 9/2020 | |
| WO | WO-2020253026 A1 * | 12/2020 | ......... H02M 1/4208 |

* cited by examiner

*Primary Examiner* — Dominic E Hawkins
(74) *Attorney, Agent, or Firm* — CKC & Partners Co., LLC

(57) ABSTRACT

The application provides a current detecting circuit, including a current transformer having a primary winding for receiving a current to be detected and a secondary winding for generating a sampling current; a demagnetizing circuit for demagnetizing the current transformer; a chip selection circuit electrically connected to the demagnetizing circuit, and operably switched between a first mode and a second mode; a sampling circuit electrically connected to the chip selection circuit to sample the sampling current, and outputting a sampling signal to a controller; and a clamping circuit electrically connected between the sampling circuit and the controller, and configured for providing a reference potential. The application further provides a converter including the current detecting circuit.

20 Claims, 22 Drawing Sheets

Receiving a current to be detected from a primary winding of a current transformer, and producing a sampling current at a secondary winding of the current transformer — S102

Flowing the sampling current through a chip selection circuit — S104

Sampling the sampling current using a sampling current electrically connected to the chip selection circuit, and outputting a sampling signal to a controller — S106

Demagnetizing the current transformer using a demagnetizing circuit — S108

FIG. 22

CURRENT DETECTING CIRCUIT, CURRENT DETECTING METHOD AND CONVERTER

CROSS-REFERENCE TO RELATED APPLICATIONS

This non-provisional application claims priority under 35 U.S.C. § 119(a) on Patent Applications No. 202110842529.8 filed on Jul. 26, 2021, in P.R. China, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

FIELD

The application relates to power electronic technology, and particularly to a current detecting circuit and a current detecting method based on a current transformer, and a converter having the current detecting circuit.

BACKGROUND

Pulse width modulation (PWM) isolated DC/DC converters widely adopt a detecting circuit based on a current transformer (CT) with a peak current control mode to avoid the case of magnetic bias, even saturation of transformers. Generally, the detecting circuit based on the CT can realize the following functions:

Reporting a current: the detecting circuit based on the CT converts a current signal into a voltage signal, and outputs the voltage signal to a digital signal processor (DSP, MCU, etc.), and the digital signal processor obtains a current value at a primary side of the CT through calculations, and reports the current value to a host computer.

Protecting a peak current: the current detection circuit based on the CT can timely sense the current value, and is suitable for protecting a peak current.

Controlling in a peak current control mode: the peak current mode compares a current signal of the inductor or the transformer with an output of an error operational amplifier, thereby generating a PWM signal. In the control method, loop compensation is easy, and can suppress influence produced by input disturbance very well, so application is relatively wide.

Controlling a magnetic bias: a primary (or secondary) current of the transformer in adjacent switching cycles, is detected, thereby correcting a duty cycle (or a phase-shifting angle) of a driving signal to balance currents of the transformer. Since the currents of the transformer comprise a load current and a magnetizing current, and the load current may be considered to be constant in adjacent cycles, the balance of bidirectional magnetizing currents can be realized.

However, in specific application, for example, in an on-board charger, when the DC/DC converter needs to have the function of bidirectional energy transmission, the detecting circuit based on the current transformer is required to have the capability of bidirectional current detection.

SUMMARY

An object of the application is to provide a detecting circuit based on a current transformer having capability of bidirectional current detection.

According to one aspect of the application, a current detecting circuit is provided, including: a current transformer having a primary winding for receiving a current to be detected and a secondary winding for generating a sampling current; a demagnetizing circuit having both ends electrically connected to the secondary winding of the current transformer to demagnetize the current transformer; a chip selection circuit electrically connected to the demagnetizing circuit, and operably switched between a first mode and a second mode, wherein the first mode is configured to detect the current in a first direction, and the second mode is configured to detect the current in a second direction opposite to the first direction; a sampling circuit electrically connected to the chip selection circuit to sample the sampling current, and outputting a sampling signal to a controller; and a clamping circuit electrically connected between the sampling circuit and the controller, and configured to provide a reference potential.

According to another aspect of the application, a converter is further provided, including a DC capacitor and a switch circuit, wherein the converter further includes the current detecting circuit according to any of the embodiments in the application, and a primary winding of a current transformer of the current detecting circuit receives a current between the DC capacitor and the switch circuit.

According to another aspect of the application, a converter is further provided, including a transformer, a primary circuit at a primary side of the transformer and a secondary circuit at a secondary side of the transformer, wherein the converter further includes the current detecting circuit according to any of the embodiments in the application, and a primary winding of a current transformer of the current detecting circuit receives a current on the primary winding of the transformer.

According to another aspect of the application, a current detecting method is further provided, including steps of: receiving a current to be detected from a primary winding of a current transformer, and producing a sampling current on a secondary winding of the current transformer; flowing the sampling current through a chip selection circuit; and sampling the sampling current and outputting a sampling signal to a controller using a sampling circuit electrically connected to the chip selection circuit, wherein when the current to be detected flows in a first direction, the chip selection circuit is set to a first mode, and when the current to be detected flows in a second direction opposite to the first direction, the chip selection circuit is set to a second mode, and the sampling circuit is clamped to a reference potential through a clamping circuit.

According to the current detecting circuit based on the current transformer provided in the application, currents in different directions can be detected by setting the mode of the chip selection circuit to one of the first mode or the second mode.

BRIEF DESCRIPTION OF THE DRAWINGS

FIG. 22 illustrates a current detecting method according to one embodiment of the application.

DETAILED DESCRIPTION

Figure 1:
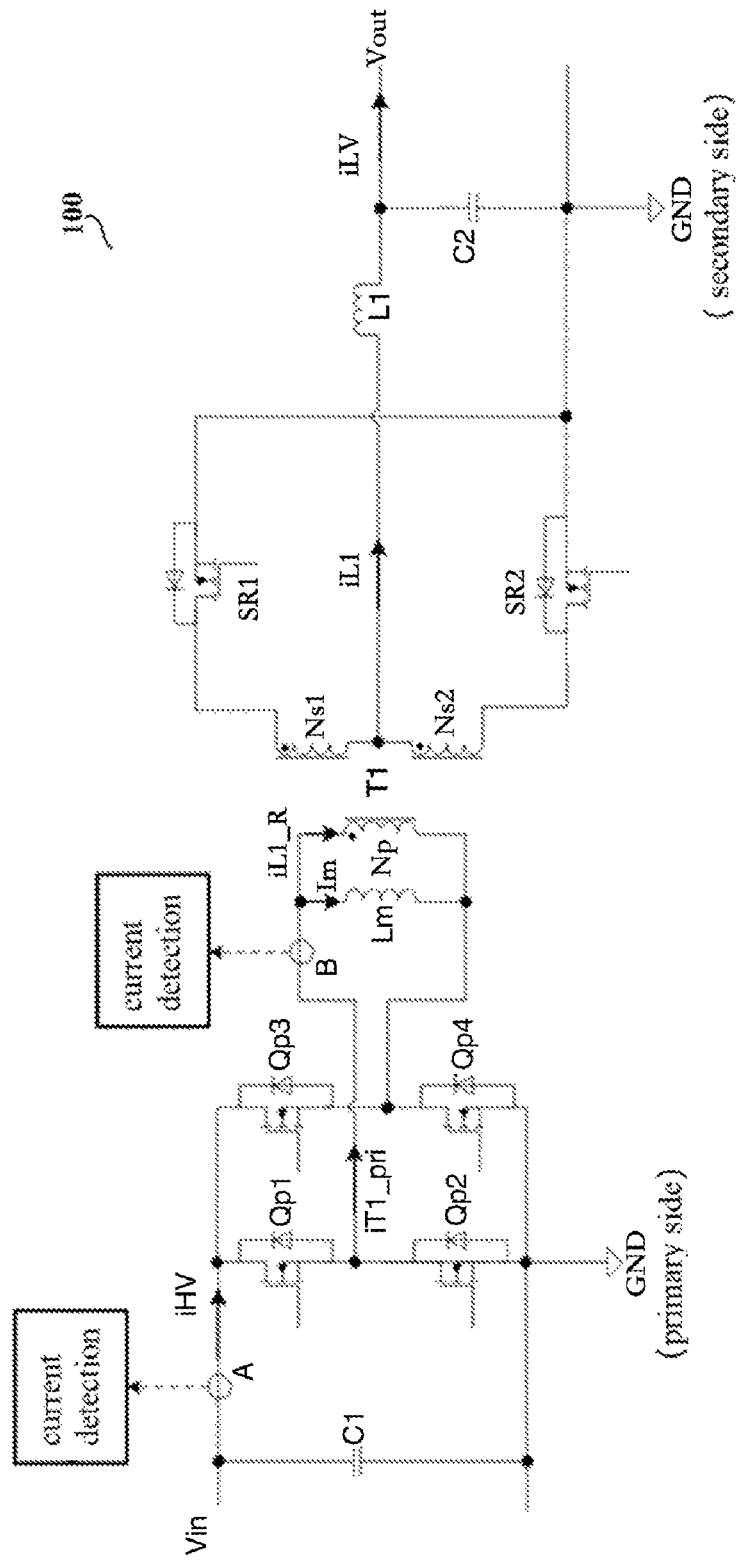
FIG. 1 illustrates a circuit diagram of a converter where a current shall be detected.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that the invention will be thorough and complete, and the conception of exemplary embodiments will be fully conveyed to those skilled in the art. In the drawings, the same reference sign denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. The embodiments may use relative phrases, such as, "upper" or "lower" to describe a relative relation of one signed component over another component. It shall be understood that if the signed device reverses to turn upside down, the described component on an "upper" side will become a component on a "lower" side. In addition, the terms "first", "second" and the like in the claims are only used as signs, instead of numeral limitations to objects.

FIG. 1 illustrates a circuit diagram of a converter 100 where a current shall be detected in one embodiment. The converter 100 shown in FIG. 1 is a DC/DC converter with many applications, and includes a transformer T1, a primary circuit connected to a primary side of the transformer T1, and a secondary circuit connected to a secondary side of the transformer T1. The primary circuit of the converter 100 receives an input voltage Vin from an input end, converts the input voltage Vin into an output voltage Vout via the primary circuit, the transformer T1 and the secondary circuit, and outputs the output voltage Vout via an output end. Moreover, the converter 100 further includes an input capacitor C1 (a DC capacitor) connected in parallel to the input end of the converter 100 and an output capacitor C2 connected in parallel to the output end of the converter 100.

It can be understood that the converter 100 also may be other types of converters, such as a DC/AC converter or an AC/DC converter, and the current detecting circuit also may be configured to detect a current of the converter at other positions, but the application is not limited thereto. The converter can be controlled to operate bidirectionally, and taking the DC/DC converter of FIG. 1 as an example, energy can be delivered from the primary side to the secondary side of the transformer, and also can be delivered from the secondary side to the primary side of the transformer, so the input end and the output end in the application do not function to limit the flow direction of energy.

The transformer T1 has a primary winding Np and two secondary windings Ns1 and Ns2 connected in series, and an inductor Lm in FIG. 1 is equivalent to a magnetizing inductance on the primary side of the transformer T1. The primary circuit of the converter 100 is connected between the input end and the primary winding Np of the transformer T1, and includes a full bridge circuit consisting of four switches Qp1 to Qp4. The four switches Qp1 to Qp4 can be but not limited to MOSFETs. The secondary winding of the transformer T1 is a center tap structure, and the secondary circuit is connected between the secondary winding and the output end, and includes a rectifier circuit consisting of two switches (e.g., synchronous rectifiers) SR1 and SR2. The switches SR1 and SR2 can be but not limited to MOSFETs.

The current detecting circuit can be connected to the position A of the converter 100 for detecting the current iHV on the connecting line between the input capacitor C1 and the full bridge circuit, or the current detecting circuit also can be connected to the position B of the converter 100 for detecting the current iT1_pri on the primary side of the transformer T1.

Figure 2:
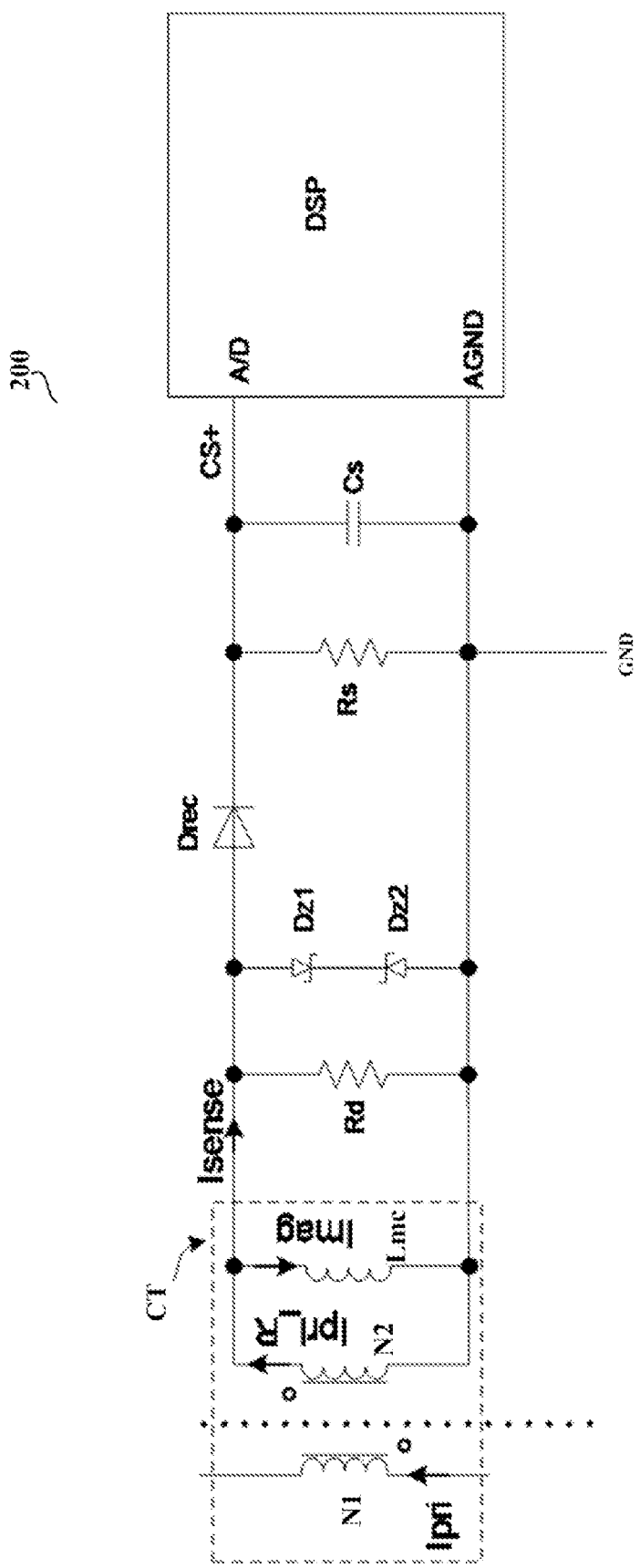
FIG. 2 illustrates a conventional current detecting circuit.
Figure 5:
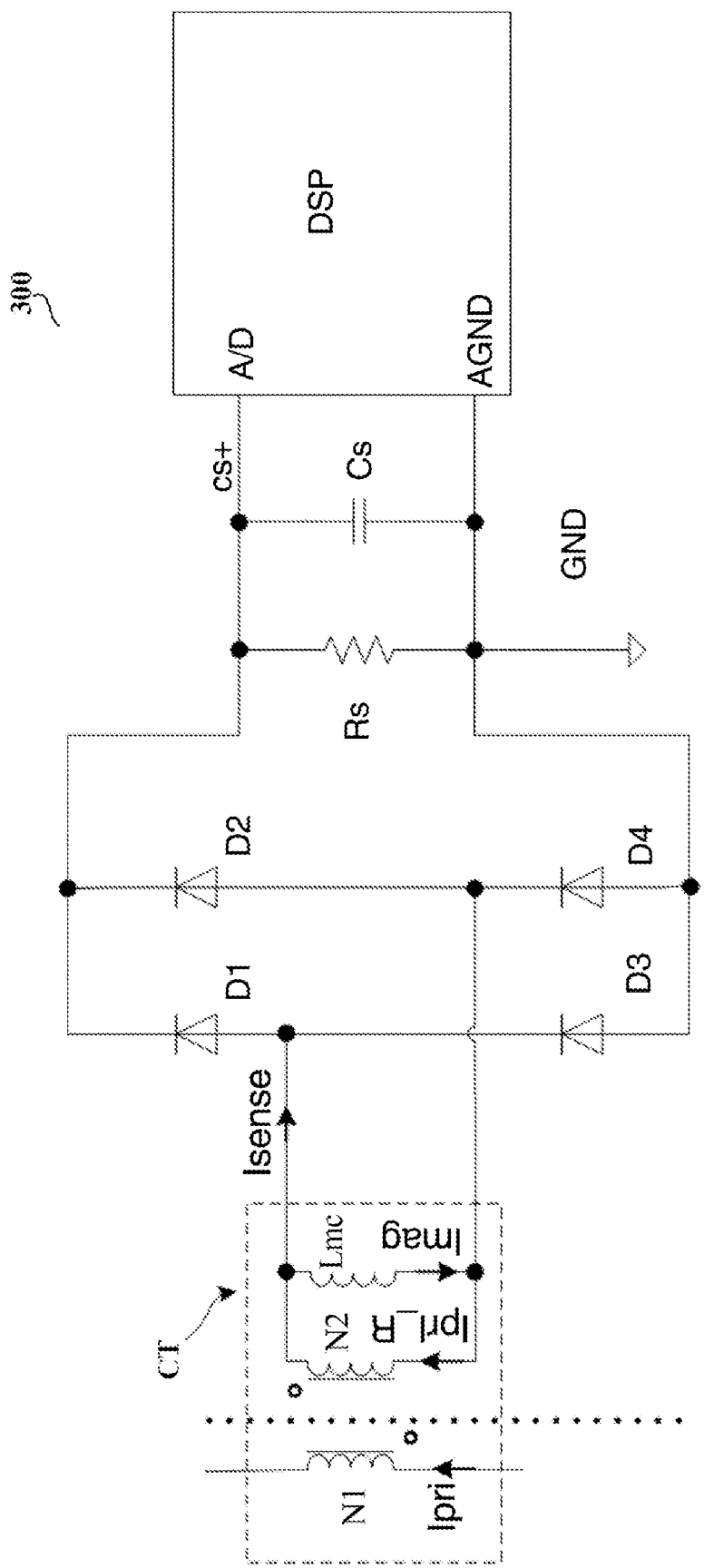
FIG. 5 illustrates another conventional current detecting circuit.

FIGS. 2 and 5 illustrate two current detecting circuits in the prior art.

As shown in FIG. 2, a current detecting circuit 200 has a current transformer CT. In the current detecting circuit 200, a post stage of the current transformer CT is connected to a demagnetizing resistor Rd, clamping diodes Dz1 and Dz2, a rectifier diode Drec, a sampling resistor Rs and a filter capacitor Cs sequentially. A sampling voltage signal CS+ on the sampling resistor Rs is supplied to a digital signal processor DSP.

Hereinafter the operation of the current detecting circuit 200 is simply described with reference to FIGS. 3 and 4.

When the current detecting circuit 200 is connected to the position A of the converter 100 in FIG. 1, a primary side of the current transformer CT receives a current Ipri (iHV) to be detected from the position A of the converter 100, and a secondary side of the current transformer CT generates a current Ipri_R by induction. Assuming that a magnetizing current flowing the magnetizing inductance Lmc of the secondary side of the current transformer CT is Imag, a total current Isense flowing out of the secondary side of the current transformer CT satisfies the following formula (1):

$$Isense = Ipri\_R - Imag \quad (1)$$

When a primary current Ipri of the current transformer CT is 0, a secondary current Ipri_R is also 0. The magnetizing current Imag of the current transformer CT continues to flow in an original direction, and flows through the demagnetizing resistor Rd, so the energy of the magnetizing inductance Lmc is consumed on Rd. When the magnetizing current Imag of the current transformer CT is decreased to 0, the current transformer CT completes demagnetizing via the demagnetizing resistor Rd.

However, when the primary current Ipri of the current transformer CT is opposite to a current direction shown in FIG. 2 (i.e., from top to bottom), the Ipri_R induced by the secondary side of the current transformer CT is also opposite to a direction shown in FIG. 2. Due to a reversed blocking function of the rectifier diode Drec, the secondary current Ipri_R can only flow through the demagnetizing resistor Rd. The secondary current Ipri_R produces a negative voltage on the demagnetizing resistor Rd, and allows the magnetizing current Imag begin to increase from 0 in a direction opposite to the direction shown in FIG. 2, and also flows through the demagnetizing resistor Rd. At this time, a sampling voltage won't be produced on the sampling resistor Rs. If energy of the magnetizing inductance of the current transformer CT is accumulated to exceed a certain value, the current transformer CT is saturated.

The current detecting circuit 200 shown in FIG. 2 can only detect a unidirectional current, and the current signal shall be in a pulse form, such as, a pulse square wave, a pulse trapezoidal wave, or the like. A pulse current must be decreased to 0 before the current transformer CT is saturated. Subsequently, the current transformer CT begins to demagnetize. Only after the demagnetizing succeeds, the next pulse signal can be detected.

Figure 3:
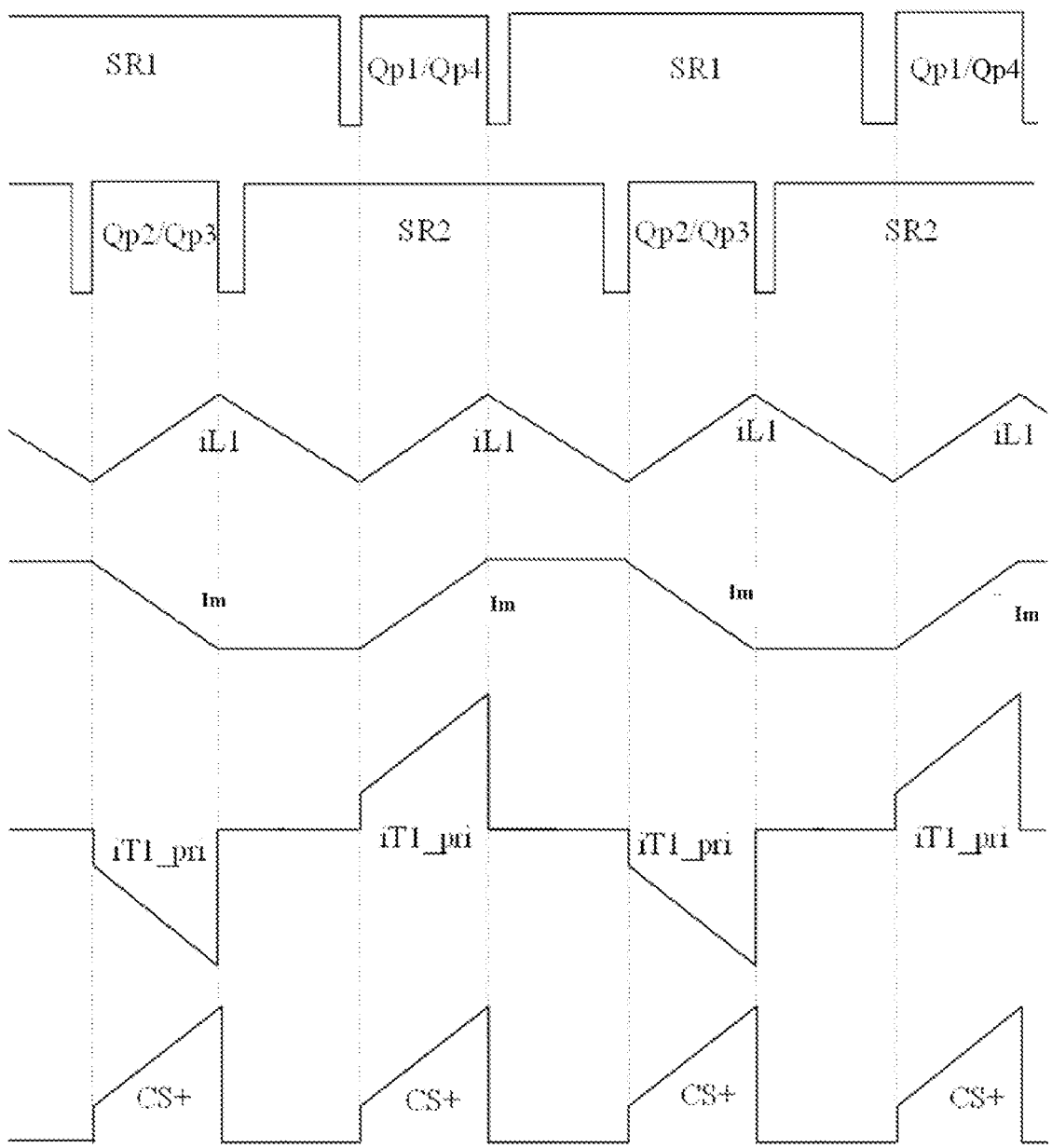
FIG. 3 and FIG. 4 illustrate waveform diagrams of relevant signals when the current detecting circuit in FIG. 2 detects the current of the converter in FIG. 1.
Figure 4:
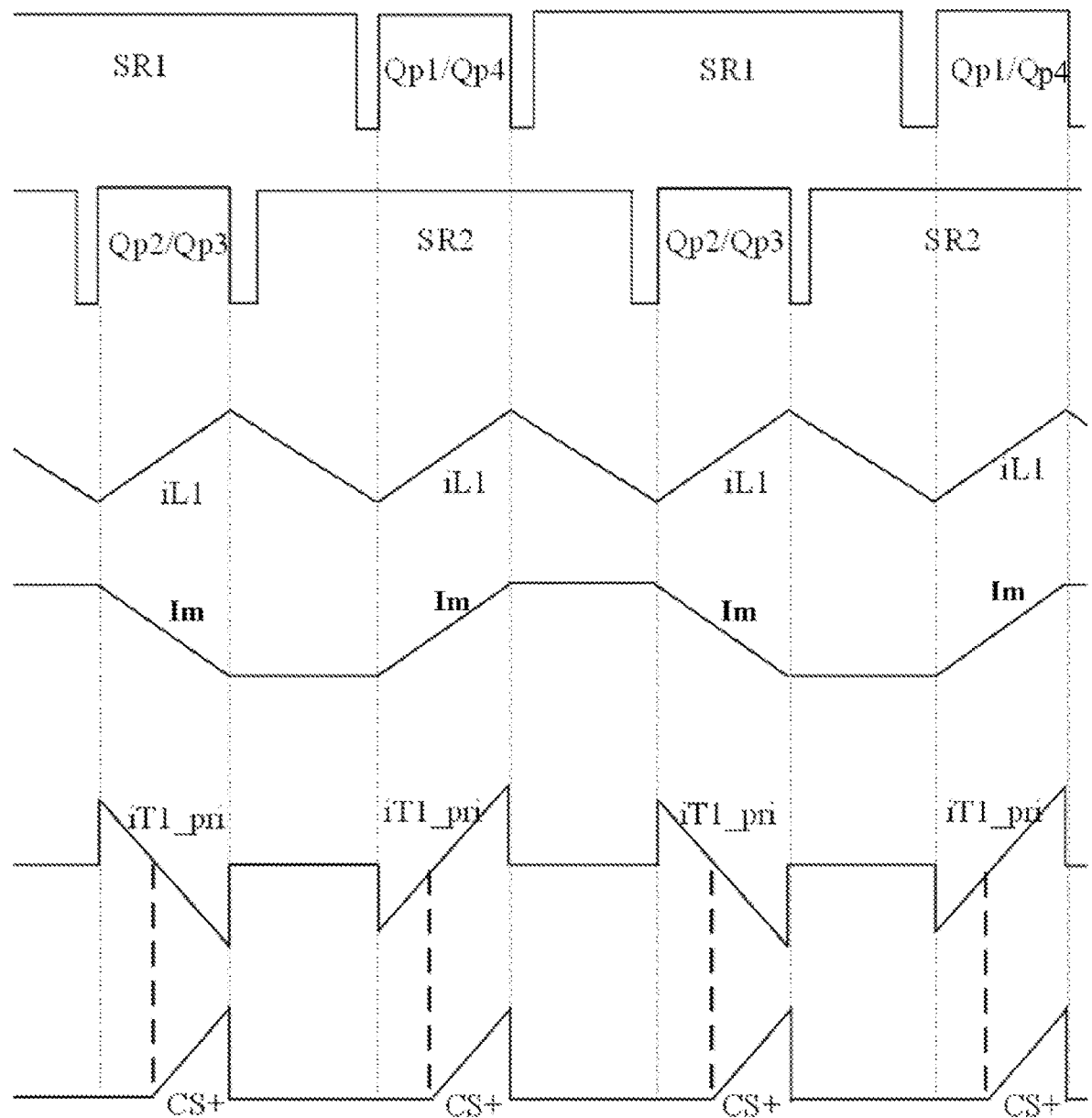

FIGS. 3 and 4 illustrate waveform diagrams of a driving signal of the converter 100, a secondary current iL1 of the transformer, a magnetizing current Im, a primary current iT1_pri and a sampling voltage signal CS+ outputted from the detecting circuit 200 when the detecting circuit 200 is connected to the position A of the converter 100 in FIG. 1 for detecting a current, when the load current iLV of the converter 100 is large and small respectively.

As shown in FIG. 3, when the load current iLV is large, since the current Ipri to be detected from the current detecting circuit 200 is an input current of the full-bridge switching circuit of the converter 100, the current signal is in a unidirectional pulse form, and the sampling voltage signal CS+ outputted from the detecting circuit 200 is also in a unidirectional pulse form. As shown in FIG. 4, when the load current iLV is small, the current Ipri to be detected from the detecting circuit 200 may be a bidirectional signal, and since the current detecting circuit 200 can only detect the unidirectional current, the sampling voltage signal CS+ outputted can only reflect a portion of the current to be detected, i.e., representing a form of unidirectional pulse triangular wave.

Therefore, the current detecting circuit 200 shown in FIG. 2 is only suitable for working conditions of energy transmission in a single direction when energy of the converter 100 shown in FIG. 1 is delivered from an input end to an output end, and when the converter 100 shall perform bidirectional energy transmission, it is not suitable any longer.

In order to realize bidirectional detection of the current, another current detecting circuit 300 is applied, and as shown in FIG. 5, a post stage of the current transformer CT is connected to a diode rectifier bridge, a sampling resistor Rs and a filter capacitor Cs sequentially. The sampling voltage signal CS+ on the sampling resistor is supplied to the digital signal processor DSP.

The current detecting circuit 300 shown in FIG. 5 can be connected to the position B of the converter 100 in FIG. 1 for detecting a current iT1_pri on the primary side of the transformer T1.

Figure 6:
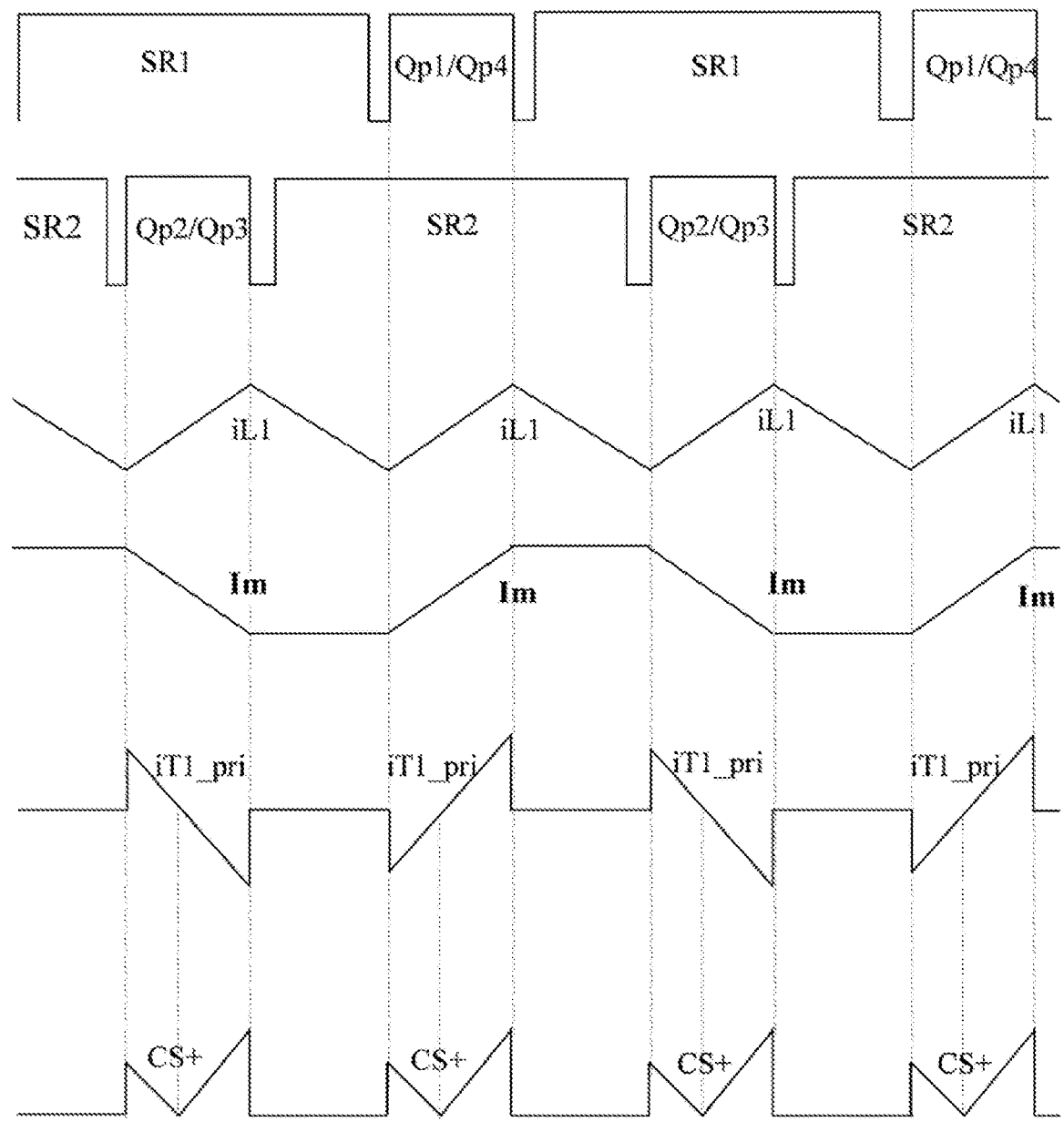
FIG. 6 illustrates a waveform diagram of relevant signals when the current detecting circuit in FIG. 5 detects the current of the converter in FIG. 1.

When the load current iLV of the converter 100 is large, the sampling voltage signal CS+ outputted from the current detecting circuit 300 is the same as the waveform shown in FIG. 3. However, when the load current iLV of the converter 100 is small, the sampling voltage signal CS+ outputted from the current detecting circuit 300 is shown in FIG. 6. In FIG. 6, the signal CS+ represents two wave heads, and an amplitude is decreased first and then increased, so the converter 100 cannot directly control a peak current using the detection results of the current detecting circuit 300.

Figure 7:
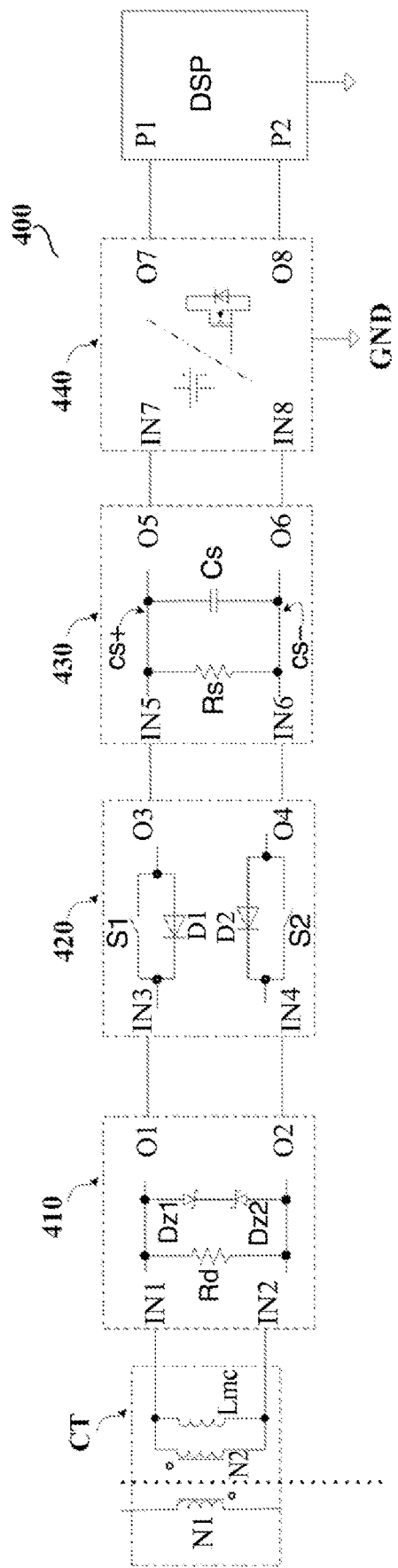
FIG. 7 illustrates a block diagram of a structure of a current detecting circuit according to one embodiment of the application.

FIG. 7 illustrates a structural block diagram of a current detecting circuit 400 according to one embodiment of the application.

As shown in FIG. 7, the current detecting circuit 400 includes a current transformer CT, a demagnetizing circuit 410, a chip selection circuit 420, a sampling circuit 430 and a clamping circuit 440.

The current transformer CT has a primary winding N1 and a secondary winding N2, and the inductor Lmc in FIG. 7 is illustrated to be a magnetizing inductance of the current transformer CT. When the current detecting circuit 400 is connected to a DC/DC converter for detecting a current, the current to be detected from the converter flows into the primary winding N1, while inducing a secondary current on the secondary winding N2, and producing a magnetizing current on the magnetizing inductance Lmc, and a sampling current is obtained according to the secondary current and the magnetizing current.

The demagnetizing circuit 410 has a first input end IN1, a second input end IN2, a first output end O1 and a second output end O2. The first input end IN1 and the second input end IN2 of the demagnetizing circuit 410 are electrically connected to two ends of the secondary winding N2 of the current transformer CT respectively. Similarly with the current detecting circuit 200 described in FIG. 2, in some embodiments combined with the embodiments of the application, the demagnetizing circuit 410 may have a demagnetizing resistor Rd and a voltage clamping branch. One end of the demagnetizing resistor Rd is electrically connected to the first input end IN1 and the first output end O1 of the demagnetizing circuit 410, and another end of the demagnetizing resistor Rd is electrically connected to the second input end IN2 and the second output end O2 of the demagnetizing circuit 410. In one embodiment, the voltage clamping branch can be formed by voltage clamping diodes Dz1 and Dz2 reversely connected in series, and the voltage clamping branch is connected in parallel to the demagnetizing resistor Rd. Therefore, the demagnetizing circuit 410 may be configured for demagnetizing the current transformer CT, and the operation way is the same as the demagnetizing way of the current detecting circuit 200 in FIG. 2, so the details are not described here.

The chip selection circuit 420 has a first input end IN3, a second input end IN4, a first output end O3 and a second output end O4. The first input end IN3 and the second input end IN4 of the chip selection circuit 420 are connected to the first output end O1 and the second output end O2 of the demagnetizing circuit 410 respectively. The chip selection circuit 420 may be operably switched between a first mode and a second mode, and the first mode and the second end can be configured to detect a bidirectional current.

The sampling circuit 430 has a first input end IN5 (i.e., a first sampling end), a second input end IN6 (i.e., a second sampling end), a first output end O5 and a second output end O6. The first input end IN5 and the second input end IN6 of the sampling circuit 430 are electrically connected to the first output end O3 and the second output end O4 of the chip selection circuit 420 respectively. In some embodiments combined with the embodiments of the application, the sampling circuit 430 has a sampling resistor Rs and a sampling capacitor Cs connected in parallel. One end of the sampling resistor Rs is electrically connected to the first input end IN5 and the first output end O5 of the sampling circuit 430, and another end of the sampling resistor Rs is electrically connected to the second input end IN6 and the second output end O6 of the sampling circuit 430. One end of the sampling capacitor Cs is electrically connected to the first input end IN5 and the first output end O5 of the sampling circuit 430, and another end of the sampling capacitor Cs is electrically connected to the second input end IN6 and the second output end O6 of the sampling circuit 430. The resistance of the sampling resistor Rs can be 10% or less, 5% or less, 2% or less, or even 1% or less of the resistance of the demagnetizing resistor Rd. The capacitance of the sampling capacitor Cs is small for filtering function. Therefore, when the sampling current on the secondary side of the current transformer CT flows through the sampling resistor Rs, a positive sampling voltage CS+ and a negative sampling voltage CS− can be obtained at both ends of the sampling resistor Rs. The positive sampling voltage CS+ is supplied to a first A/D input port P1 of a controller (e.g., the digital signal processor DSP), and the negative sampling voltage CS− is supplied to a second A/D input port P2 of the digital signal processor DSP. Optionally, the digital signal processor DSP can comprise a comparator for monitoring levels of the positive sampling voltage CS+ and/or the negative sampling voltage CS− for overcurrent protection function. The controller also can be a control chip in other forms, such as, a single-chip microcomputer, a FPGA, or the like, but the application is not limited thereto.

The clamping circuit 440 has a first input end IN7, a second input end IN8, a first output end O7 and a second output end O8. The first input end IN7 and the second input end IN8 of the clamping circuit 440 are connected to the first output end O5 and the second output end O6 of the sampling circuit 430 respectively. The clamping circuit 440 is configured to supply a reference potential, such that the common-mode voltages of the positive sampling voltage CS+ and the negative sampling voltage CS− relative to the grounds GND of the controller are predictable and non-floating values. The sampling voltage outputted from the current detecting circuit 400 is within a range of input voltage of the digital signal processor DSP.

In some embodiments of the application, the chip selection circuit 420 includes a first branch electrically connected between the first input end IN3 and the first output end O3 and a second branch electrically connected between the second input end IN4 and the second output end O4. When the chip selection circuit 420 is in the first mode, the current detecting circuit 400 may be configured to detect a current in the first direction. For example, the current in the first direction is a current flowing through the primary winding N1 of the current transformer CT from bottom to top in FIG. 7. Moreover, the chip selection circuit 420 only allows the sampling current produced on the secondary side of the current transformer CT to flow from the first input end IN3 to the first output end O3 via the first branch, and then flows to the sampling circuit 430, and only allows a sampling current flowing out of the sampling circuit to flow from the second output end O4 to the second input end IN4 via the second branch. When the chip selection circuit 420 is in the second mode, the current detecting circuit 400 may be configured to detect the current in a second direction opposite to the first direction. For example, the current in the second direction is a current flowing through the primary winding N1 of the current transformer CT from top to bottom in FIG. 7. Moreover, the chip selection circuit 420 only allows a sampling current produced on the secondary side of the current transformer CT to flow from the second input end IN4 to the second output end O4 via the second branch, and then flows to the sampling circuit 430, and only allows a sampling current flowing out of the sampling circuit to flow from the first output end O3 to the first input end IN3 via the first branch.

Specifically, as shown in FIG. 7, the first branch of the chip selection circuit 420 includes a first switch S1 and a first diode D1 connected in parallel, and the second branch includes a second switch S2 and a second diode D2 connected in parallel. In one embodiment, the anodes of the first diode D1 and the second diode D2 are connected to the first output end O3 and the second output end O4 respectively, and the cathodes of the first diode D1 and the second diode D2 are connected to the first input end IN3 and the second input end IN4 respectively. When the chip selection circuit 420 is in the first mode, the first switch S1 and the second diode D2 are turned on, the second switch S2 is turned off, and the first diode D1 is cut off. When the chip selection circuit 420 is in the second mode, the second switch S2 and the first diode D1 are turned on, the first switch S1 is turned off, and the second diode D2 is cut off. It can be understood that connection way of the first diode D1 and the second diode D2 is not limited to be the above-described case, and it is also possible that the anodes of the two diodes are connected to the first input end IN3 and the second input end IN4 respectively, and the cathodes are connected to the first output end O3 and the second output end O4 respectively.

In some embodiments of the application, the first switch S1 and the second switch S2 in the chip selection circuit 420 are N-channel MOSFETs, and the first diode D1 and the second diode D2 can be parasitic diodes (body diodes) of the first switch S1 and the second switch S2 respectively. Alternatively, the first diode D1 and the second diode D2 also can be additional diodes, such as, Schottky diodes.

Figure 8:
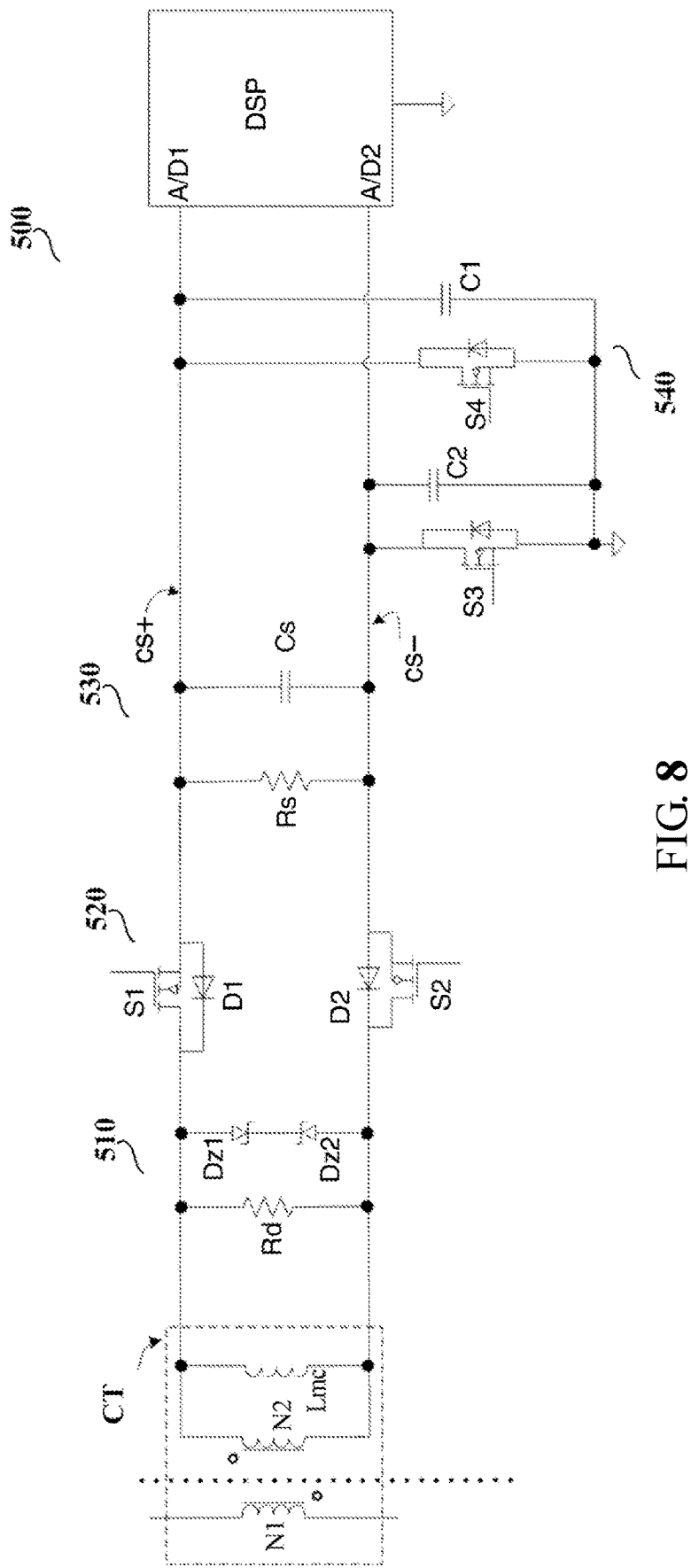
FIG. 8 illustrates a circuit diagram of a current detecting circuit according to one embodiment of the application.

FIG. 8 illustrates a current detecting circuit 500 according to one embodiment of the application. The current detecting circuit 500 includes a current transformer CT, a demagnetizing circuit 510, a chip selection circuit 520, a sampling circuit 530 and a clamping circuit 540. The current transformer CT, the demagnetizing circuit 510, the chip selection circuit 520 and the sampling circuit 530 of the current detecting circuit 500 have been described in FIG. 7, so the details are not repeated here.

In the embodiment of FIG. 8, it further illustrates a specific structure of the clamping circuit 540, and as shown in FIG. 8, the clamping circuit 540 includes a first filter capacitor C1, a second filter capacitor C2, a third switch S3 and a fourth switch S4. The first filter capacitor C1 and the fourth switch S4 connected in parallel are electrically connected between a clamping node (i.e., a ground point) clamped to the reference potential and the first output end of the sampling circuit 530. The second filter capacitor C2 and the third switch S3 connected in parallel are electrically connected between the clamping node (i.e., the ground point) and the second output end of the sampling circuit 530. When the chip selection circuit 520 is in the first mode, the third switch S3 in the clamping circuit 540 is turned on, and the fourth switch S4 is turned off. When the chip selection circuit 520 is in the second mode, the fourth switch S4 in the clamping circuit 540 is turned on, and the third switch S3 is turned off.

Figure 9:
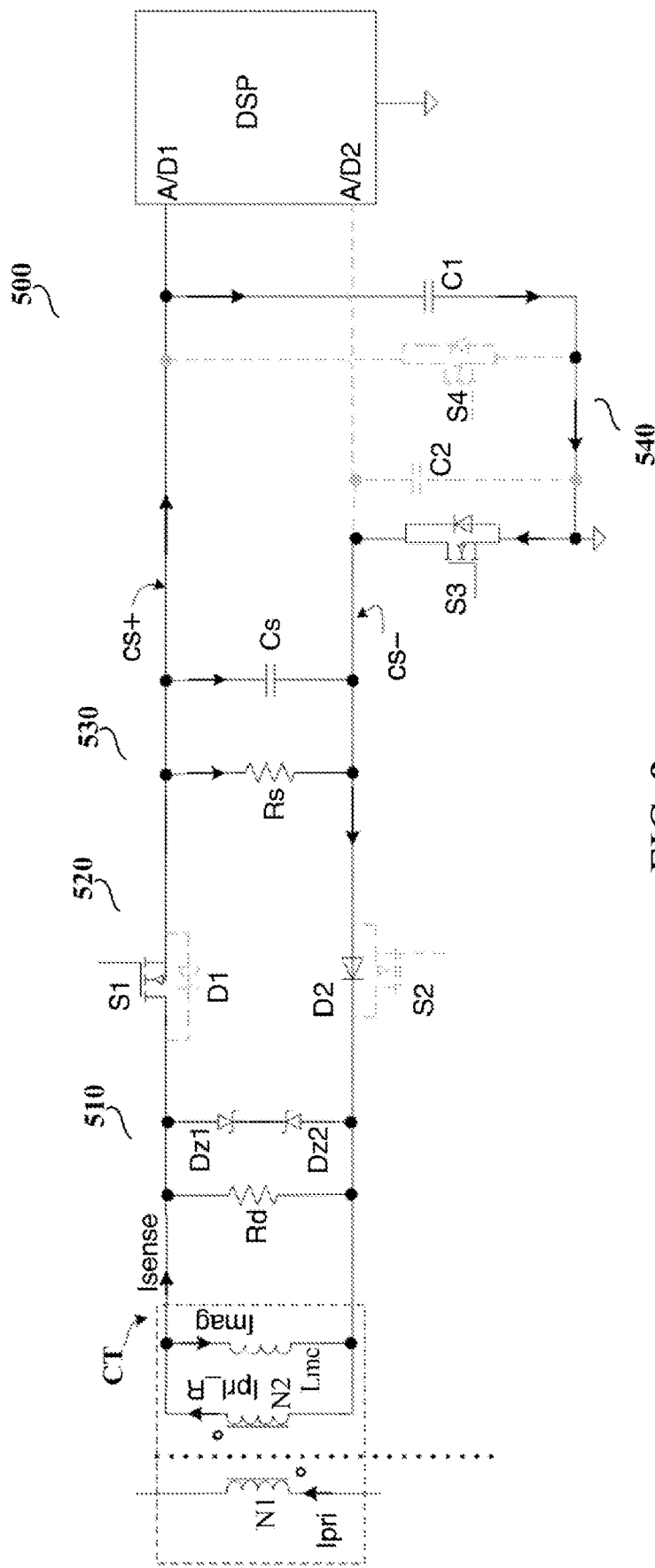
FIG. 9 illustrates a current flow path diagram of the current detecting circuit of FIG. 8 in a first mode.
Figure 10:
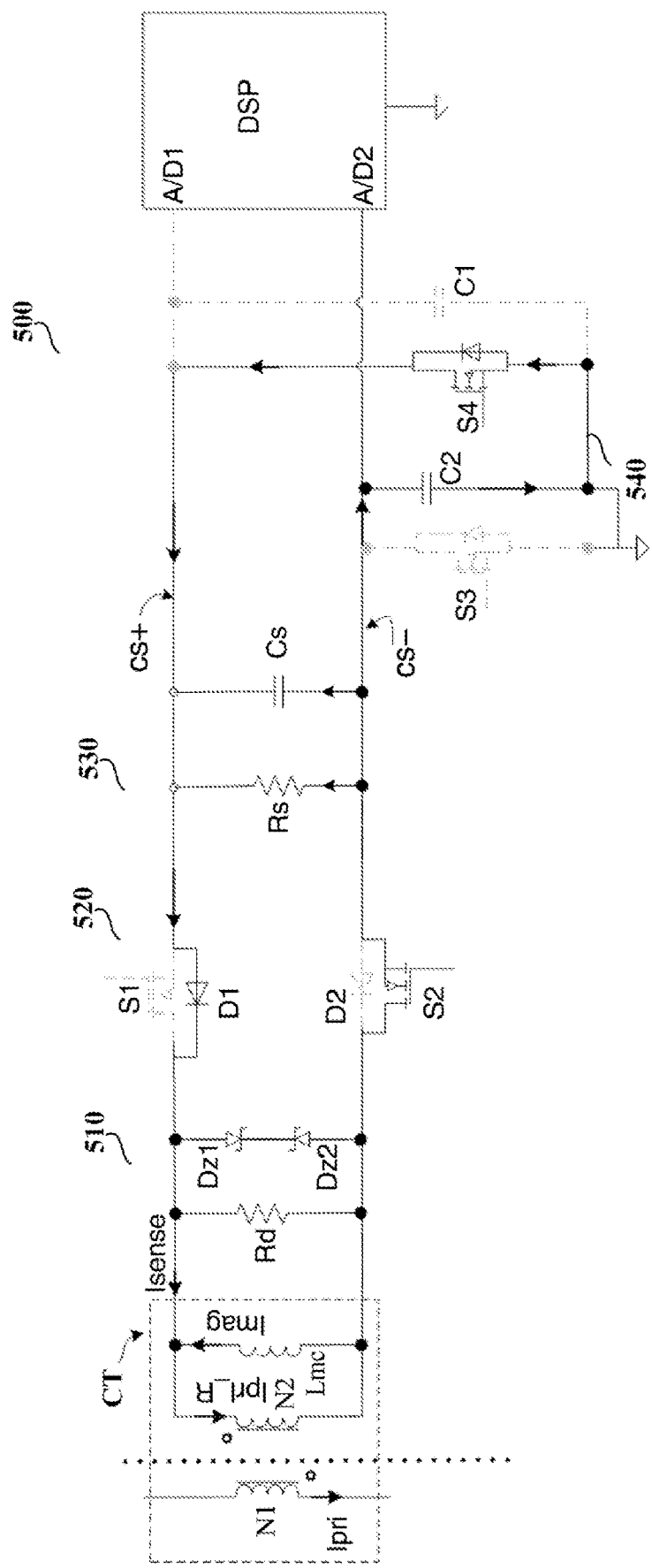
FIG. 10 illustrates a current flow path diagram of the current detecting circuit of FIG. 8 in a second mode.

FIGS. 9 and 10 illustrate current flow path diagrams of the current detecting circuit 500 when the current detecting circuit 500 in FIG. 8 is in the first mode and the second mode. FIGS. 9 and 10 illustrate electric elements that are turned off in the current detecting circuit 500 in different modes with gray line.

As shown in FIG. 9, when the current detecting circuit 500 is in the first mode, the first switch S1 of the chip selection circuit 520 is turned on, the first diode D1 is reversely cut off, the second switch S2 is turned off, the second diode D2 is turned on, and the third switch S3 in the clamping circuit 540 is turned on, such that the second filter capacitor C2 is short-circuited, the fourth switch S4 is turned off, and the sampling current flows through the first filter capacitor C1. The on and off of the respective switches in the current detecting circuit 500 may be controlled by the digital signal processor DSP, or one separate control chip.

As shown in FIG. 10, when the current detecting circuit 500 is in the second mode, the first switch S1 of the chip selection circuit 520 is turned off, the first diode D1 is turned on, the second switch S2 is turned on, the second diode D2 is reversely cut off, and the fourth switch S4 in the clamping circuit 540 is turned on, such that the first filter capacitor C1 is shorted, the third switch is turned off, and the sampling current flows through the second filter capacitor C2.

As is described previously, when the current detecting circuit 500 is in the first mode, the current detecting circuit 500 may be configured to detect a current in a first direction, i.e., the current in the first direction is the current Ipri flowing through the primary winding N1 of the current transformer CT from bottom to top in FIG. 9. At this time, a vector sum of the current Ipri_R induced by the secondary winding N2 of the current transformer CT and the magnetizing current Imag is a sampling current Isense, and as shown in FIG. 9, the sampling current Isense flows out of one end of the secondary side of the current transformer CT via the first switch S1, the first filter capacitor C1, the third switch S3 and the second diode D2, and then returns to another end of the secondary side of the current transformer CT. When the primary current Ipri is 0, the magnetizing current Imag of the current transformer CT completes demagnetizing by the demagnetizing resistor Rd in the demagnetizing circuit 510. The voltage clamping branch is configured to prevent overvoltage at both ends of the demagnetizing resistor Rd. Since S3 is turned on, one end of the secondary winding N2 of the current transformer CT is clamped to a clamping node, for example, the clamping node is grounded or connected to a fixed electric potential, and the positive sampling voltage CS+ outputted from the current detecting circuit 500 is transmitted to a first A/D input port of the digital signal processor DSP. Similarly, when the current detecting circuit 500 is in the second mode, the current detecting circuit 500 is configured to detect a current in a direction opposite to the first direction, i.e., a current Ipri flowing through the primary winding N1 of the current transformer CT from top to bottom in FIG. 10. The sampling current Isense flows out of another end of the secondary side of the current transformer CT via the second switch S2, the second filter capacitor C2, the fourth switch S4 and the first diode D1, and then returns to one end of the secondary side of the current transformer CT. Since S4 is turned on, one end of the secondary winding N2 of the current transformer CT is clamped to a clamping node, for example, the clamping node is grounded or connected to a fixed electric potential, and the negative sampling voltage CS− outputted from the current detecting circuit 500 is transmitted to a second A/D input port of the digital signal processor DSP.

Figure 11:
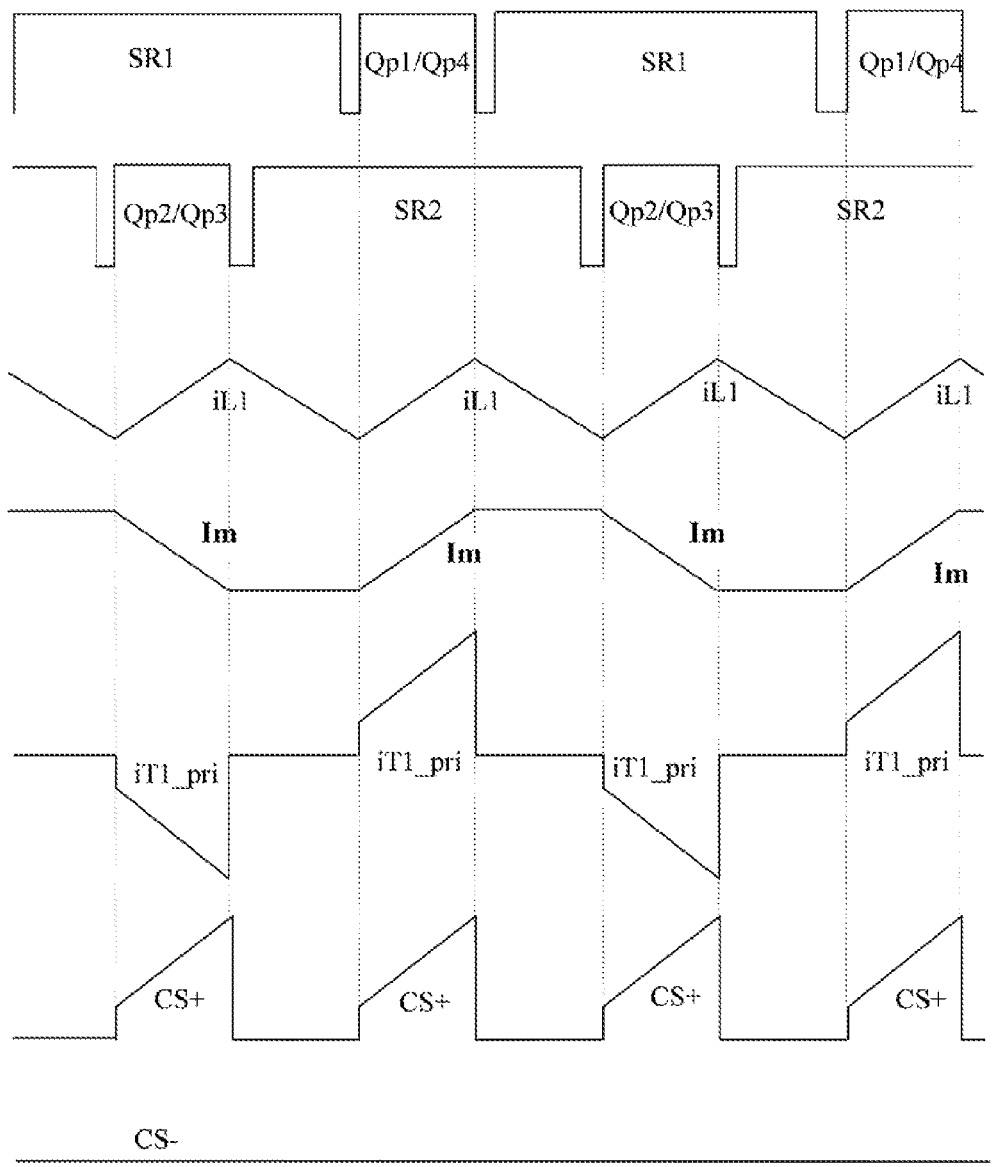
FIG. 11 illustrates a waveform diagram of relevant signals when the current detecting circuit of FIG. 9 in the first mode detects the current of the converter in FIG. 1 at the position A.

FIG. 11 illustrates a waveform diagram of a driving signal of the converter 100, a secondary current iL1 of the transformer T1, a magnetizing current Im, a primary current iT1_pri and a sampling voltage outputted from the detecting circuit 500 when the current detecting circuit 500 in the first mode is connected to the position A of the converter 100 in FIG. 1 for detecting a current.

As shown in FIG. 11, the converter 100 is positively operated, and energy is delivered from the primary side of the transformer to the secondary side of the transformer. The switches S1 and S3 of the current detecting circuit 500 are always in an on state, and the switches S2 and S4 are always in an off state. At this time, a CS+ signal represents a waveform of the current on the primary side of the current transformer CT. Since the switch S3 is turned on, CS− is clamped to a fixed level.

Figure 12:
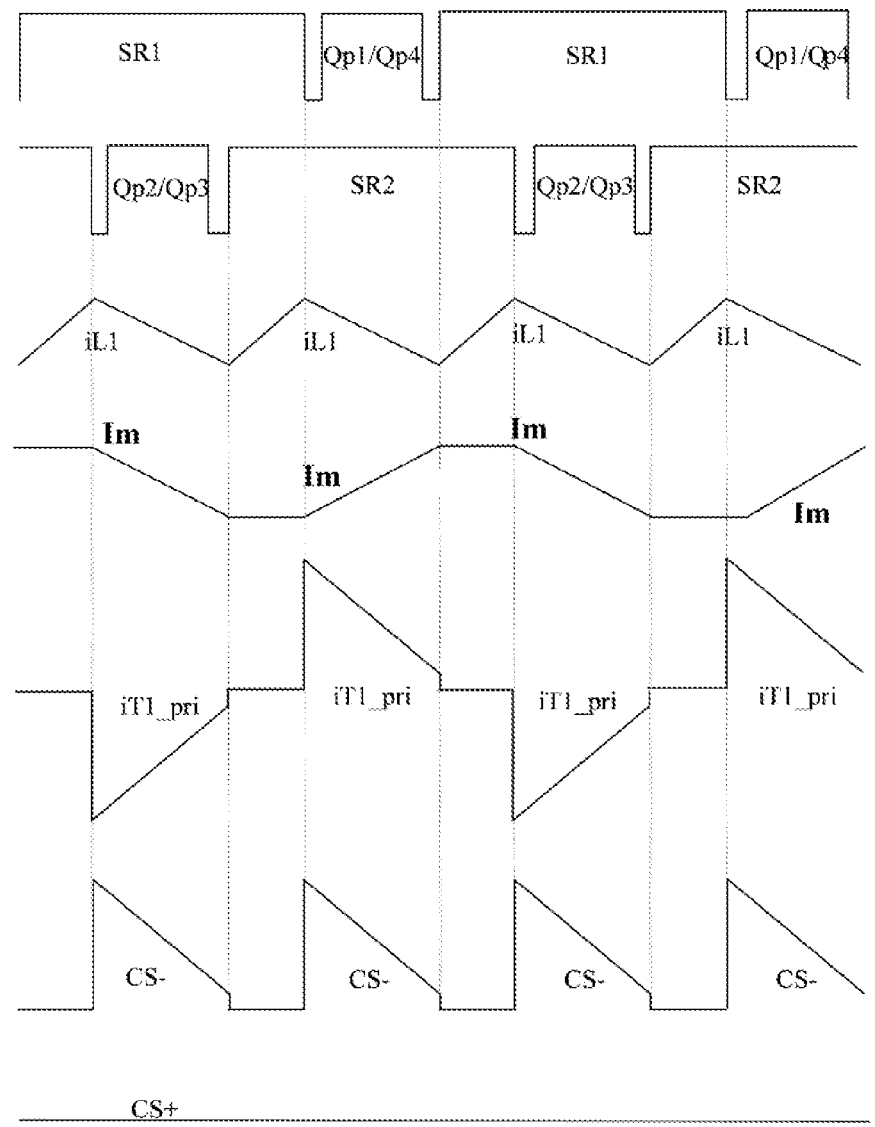
FIG. 12 illustrates a waveform diagram of relevant signals when the current detecting circuit of FIG. 10 in the second mode detects the current of the converter in FIG. 1 at the position A.

FIG. 12 illustrates a waveform diagram of a driving signal of the converter 100, a secondary current iL1 of the transformer T1, a magnetizing current Im, a primary current iT1_pri and a sampling voltage outputted from the detecting circuit 500 when the current detecting circuit 500 in the second mode is connected to the position A of the converter 100 in FIG. 1 for detecting a current.

As shown in FIG. 12, the converter 100 is reversely operated, and energy is delivered from the secondary side of the transformer T1 to the primary side of the transformer T1. When switches SR1 and SR2 of a full bridge circuit are turned on simultaneously, the current (i.e., the secondary current of the transformer T1) iL1 of a power inductor L1 is increased. At this time, the switches S2 and S4 in the current detecting circuit 500 are always in an on state, and the switches S1 and S3 are always in an off state. Here a CS− signal represents a waveform of the current on the primary side of the current transformer CT. Since the switch S4 is turned on, CS+ is clamped to a fixed level.

Figure 13:
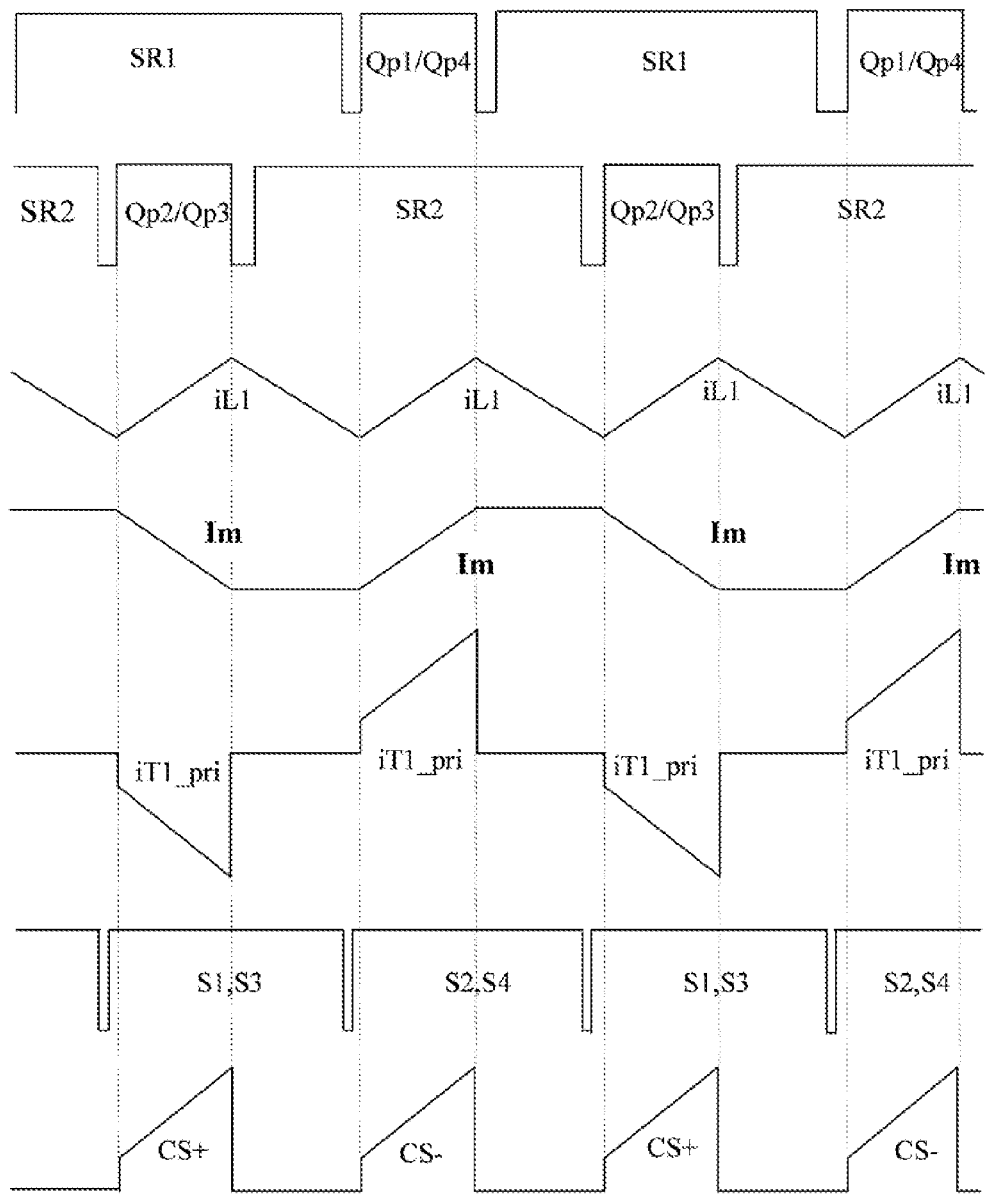
FIG. 13 illustrates a waveform diagram of relevant signals when the current detecting circuit in FIG. 8 detects the current of the converter in FIG. 1 at the position B, when the load current is large.

FIG. 13 illustrates a waveform diagram of a driving signal of the converter 100, a secondary current iL1 of the transformer T1, a magnetizing current Im, a primary current iT1_pri, a switch driving signal and a sampling voltage outputted from the current detecting circuit 500 when the current detecting circuit 500 is connected to the position B of the converter 100 in FIG. 1 for detecting a current, if a load current is large.

As shown in FIG. 13, the load current iLV is large, the driving waveforms of the switches S1 to S4 of the current detecting circuit 500 are square wave signals, and a width of square waves is larger than or equal to a width of driving signals of the switches Qp1 to Qp4 of the full bridge circuit of the converter 100. That is, if the driving signals of the switches Qp1 and Qp4 of the converter 100 are high levels, the switches S2 and S4 in the current detecting circuit 500 are also high levels. When the primary current iT1_pri of the transformer T1 of the converter 100 flows from the switch Qp1 to the transformer T1 and then to the switch Qp4, since the chip selection circuit 520 and the clamping circuit 540 of the current detecting circuit 500 have been enabled, a sampling voltage CS− outputted from the current detecting circuit 500 can track the primary current iT1_pri of the transformer T1 very well. Similarly, when the driving signals of the switches Qp2 and Qp3 in the converter 100 are high levels, the switches S1 and S3 in the current detecting circuit 500 are also high levels, and a sampling voltage CS+ outputted from the current detecting circuit 500 can track the primary current iT1_pri of the transformer T1 very well. As can be seen, the sampling voltages CS+ and CS− outputted from the current detecting circuit 500 are pulse signals reflecting an amplitude of the primary current of the transformer T1.

Figure 14:
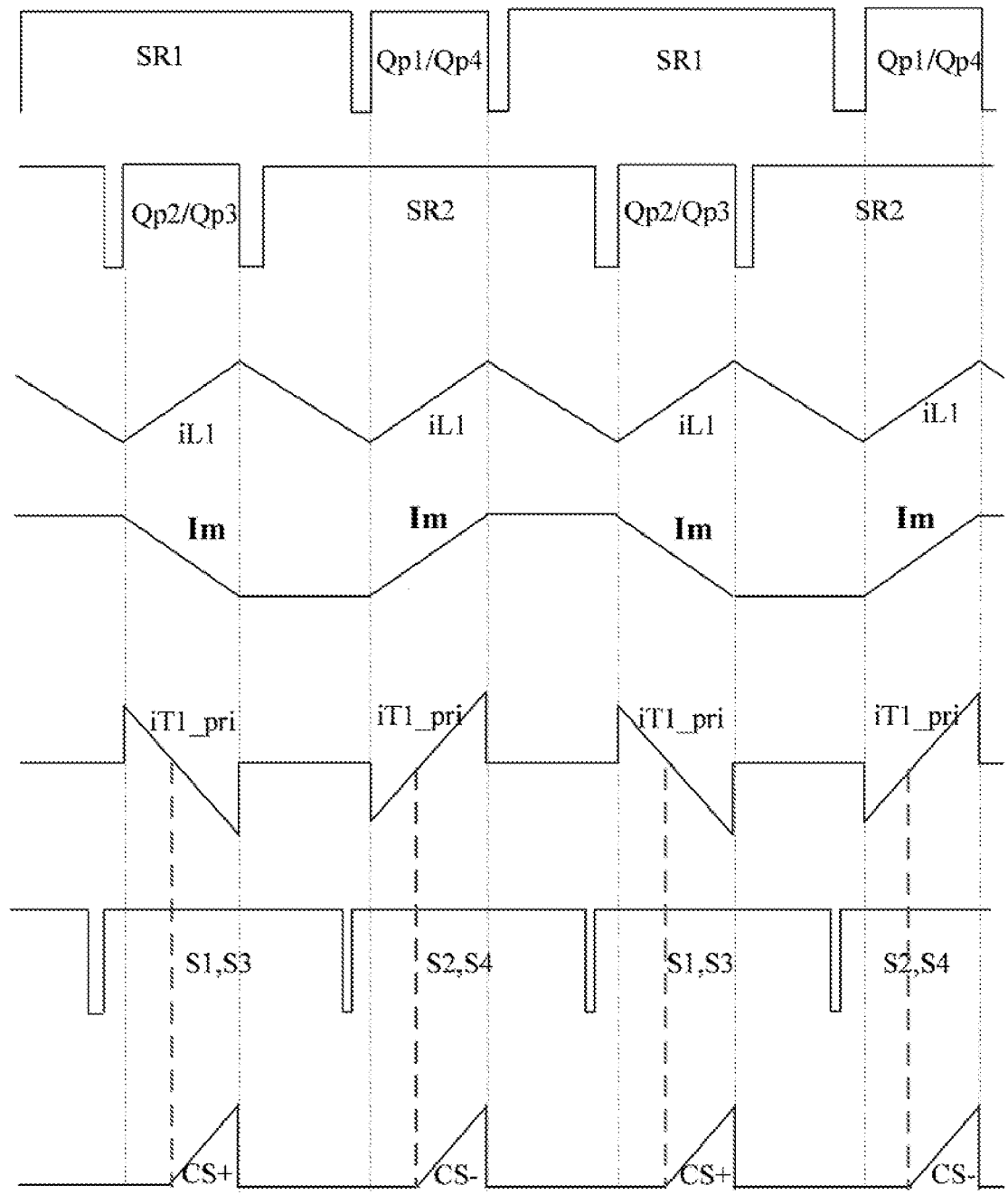
FIG. 14 illustrates a waveform diagram of relevant signals when the current detecting circuit of FIG. 8 detects the current of the converter in FIG. 1 at the position B, when the load current is small.

FIG. 14 illustrates a waveform diagram of a driving signal of the converter 100, a secondary current iL1 of the transformer, a magnetizing current Im, a primary current iT1_pri, a switch driving signal and a sampling voltage outputted from the current detecting circuit 500 when the current detecting circuit 500 is connected to the position B of the converter 100 in FIG. 1 for detecting a current, if a load current is small.

As shown in FIG. 14, the load current iLV is small, and a corresponding relation between driving signals of the switches S1 to S4 of the current detecting circuit 500 and the switches Qp1 to Qp4 of the full bridge circuit of the converter 100 is consistent with that shown in FIG. 13. At this time, since only the current in a specific direction can be detected when the current detecting circuit 500 is in any one of the modes, the sampling voltages CS+ and CS− outputted from the current detecting circuit 500 are pulsed triangular wave signals, and the phase difference is 180°. Taking the sampling voltage CS− for example, when the primary current iT1_pri of the transformer T1 of the converter 100 is increased above 0 A from negative value, the sampling voltage CS− outputted from the current detecting circuit 500 outputs a voltage value greater than 0V.

Figure 15:
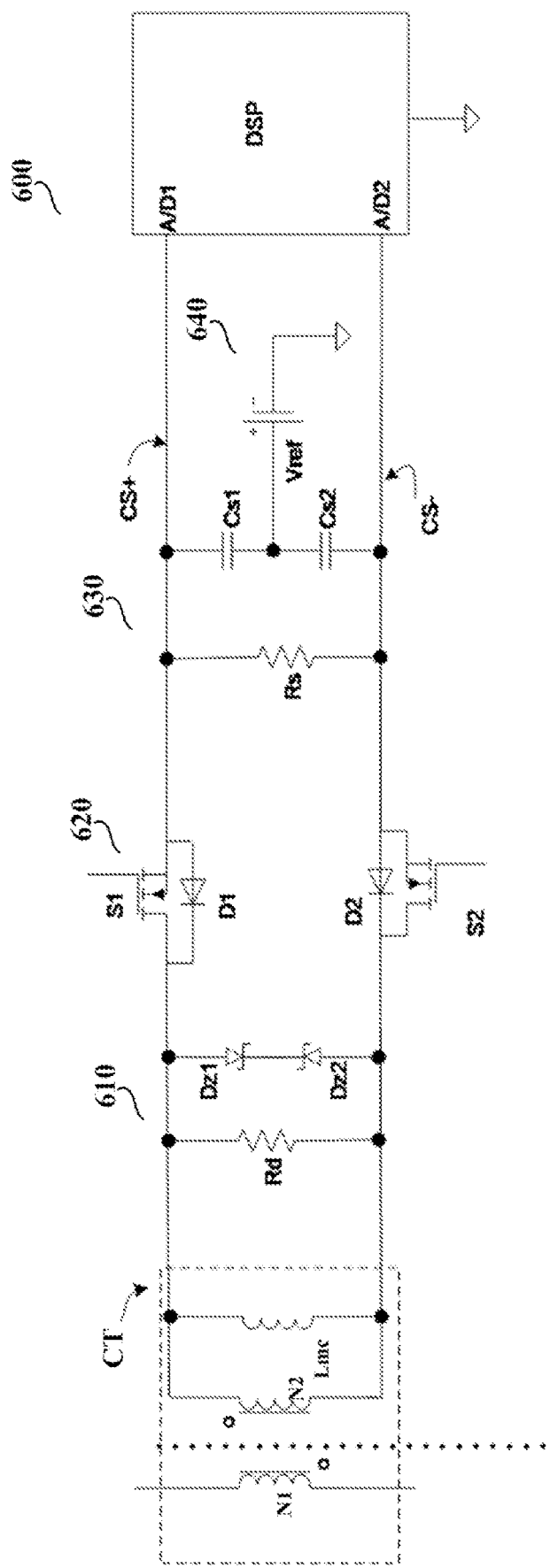
FIG. 15 illustrates a circuit diagram of a current detecting circuit according to another embodiment of the application.

FIG. 15 illustrates a current detecting circuit 600 according to another embodiment of the application. The current detecting circuit 600 includes a current transformer CT, a demagnetizing circuit 610, a chip selection circuit 620, a sampling circuit 630 and a clamping circuit 640. The current transformer CT, the demagnetizing circuit 610 and the chip selection circuit 620 of the current detecting circuit 600 are the same as the current transformer CT, the demagnetizing circuit 410 and the chip selection circuit 420 of the current detecting circuit 400 shown in FIG. 8, so the details are not described here. The current detecting circuit 600 differs from the current detecting circuit 500 in that the current detecting circuit 600 illustrates the sampling circuit 630 and the clamping circuit 640 in another form. In the current detecting circuit 600, the sampling circuit 630 is formed by a sampling resistor Rs, a first sampling capacitor Cs1 and a second sampling capacitor Cs2. One end of the sampling resistor Rs is connected to a first input end and a first output end of the sampling circuit 630, another end of the sampling resistor Rs is connected to a second input end and a second output end of the sampling circuit 630, and the first sampling capacitor Cs1 and the second sampling capacitor Cs2 are connected in parallel to the sampling resistor Rs after connecting in series. The clamping circuit 640 is used to clamp a junction node, where the first sampling capacitor Cs1 and the second sampling capacitor Cs2 are connected in series, to a reference voltage Vref.

Figure 16:
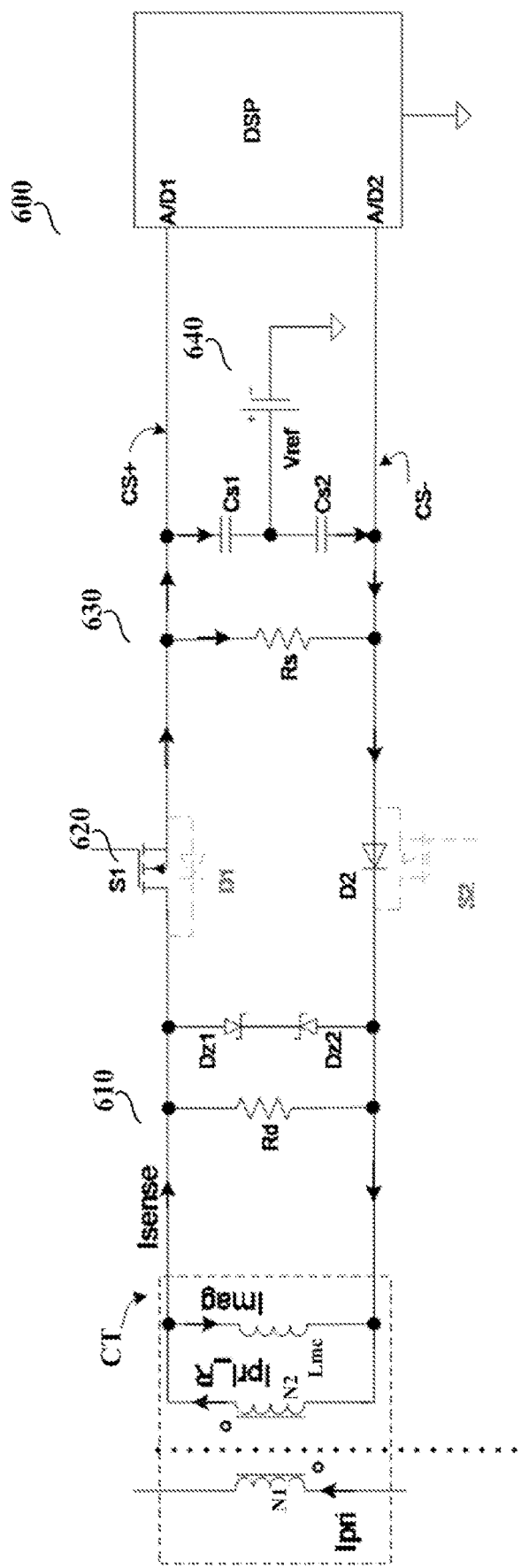
FIG. 16 illustrates a current flow path diagram of the current detecting circuit of FIG. 15 in a first mode.

FIG. 16 illustrates a current flow path diagram of the current detecting circuit 600 in a first mode. FIG. 16 illustrates electric elements turned off from the current detecting circuit 600 in the first mode using gray line.

As shown in FIG. 16, when the current detecting circuit 600 is in the first mode, a first switch S1 of the chip selection circuit 620 is turned on, a first diode D1 is cut off, a second switch S2 is turned off, and a sampling current flows through a second diode D2. The on and off states of the respective switches of the current detecting circuit 600 may be controlled by the digital signal processor DSP.

As is described above, when the current detecting circuit 600 is in the first mode, the current detecting circuit 600 may be configured to detect a current in a first direction, i.e., the current of the first direction is a current Ipri flowing through the primary winding N1 of the current transformer CT from bottom to top in FIG. 9. At this time, a direction of a sampling current Isense obtained from a current Ipri_R induced by the secondary winding N2 of the current transformer CT and a magnetizing current Imag is shown by the arrow in FIG. 16, flows out of one end of a secondary side of the current transformer CT through the first switch S1, the sampling resistor Rs, the first sampling capacitor Cs1, the sampling capacitor Cs2 and the second diode D2, and then returns back to another end of the secondary side of the current transformer CT. When the primary current Ipri is 0, the magnetizing current Imag of the current transformer CT completes demagnetizing through a demagnetizing resistor Rd in the demagnetizing circuit 610.

Figure 17:
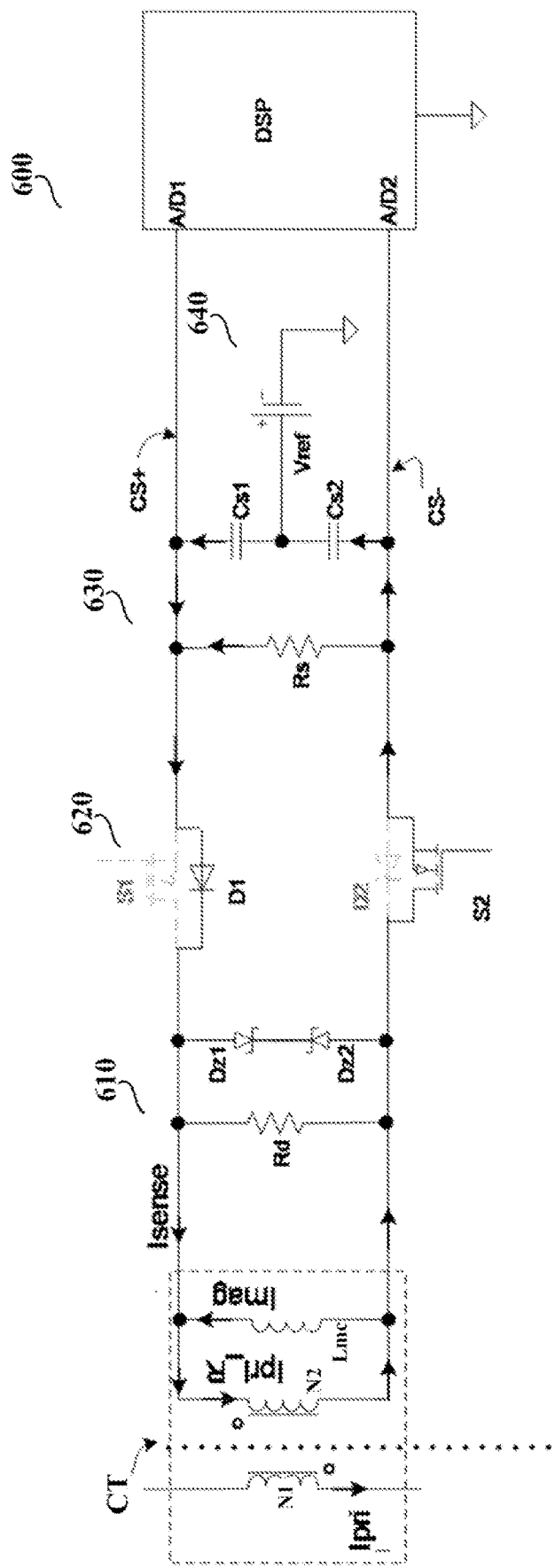
FIG. 17 illustrates a current flow path diagram of the current detecting circuit of FIG. 15 in a second mode.

FIG. 17 illustrates a current flow path diagram of the current detecting circuit 600 in a second mode. FIG. 17 illustrates electric elements turned off from the current detecting circuit 600 in the second mode using gray line.

As shown in FIG. 17, when the current detecting circuit 600 is in the second mode, a second switch S2 of the chip selection circuit 620 is turned on, a second diode D2 is cut off, a first switch S1 is turned off, and a sampling current flows through a first diode D1. The on and off states of the respective switches of the current detecting circuit 600 may be controlled by the digital signal processor DSP.

As is described above, when the current detecting circuit 600 is in the second mode, the current detecting circuit 600 may be configured to detect a current in a second direction, i.e., the current of the second direction is a current Ipri flowing through the primary winding N1 of the current transformer CT from top to bottom in FIG. 17. At this time, the direction of a sampling current Isense obtained from a current Ipri_R induced by the secondary winding N2 of the current transformer CT and a magnetizing current Imag is shown by an arrow in FIG. 17, flows out of one end of the secondary side of the current transformer CT through the second switch S2, the sampling resistor Rs, the second sampling capacitor Cs2, the first sampling capacitor Cs1 and the first diode D1, and then returns back to another end of the secondary side of the current transformer CT. When the primary current Ipri is 0, the magnetizing current Imag of the current transformer CT completes demagnetizing through a demagnetizing resistor Rd in the demagnetizing circuit 610.

Figure 18:
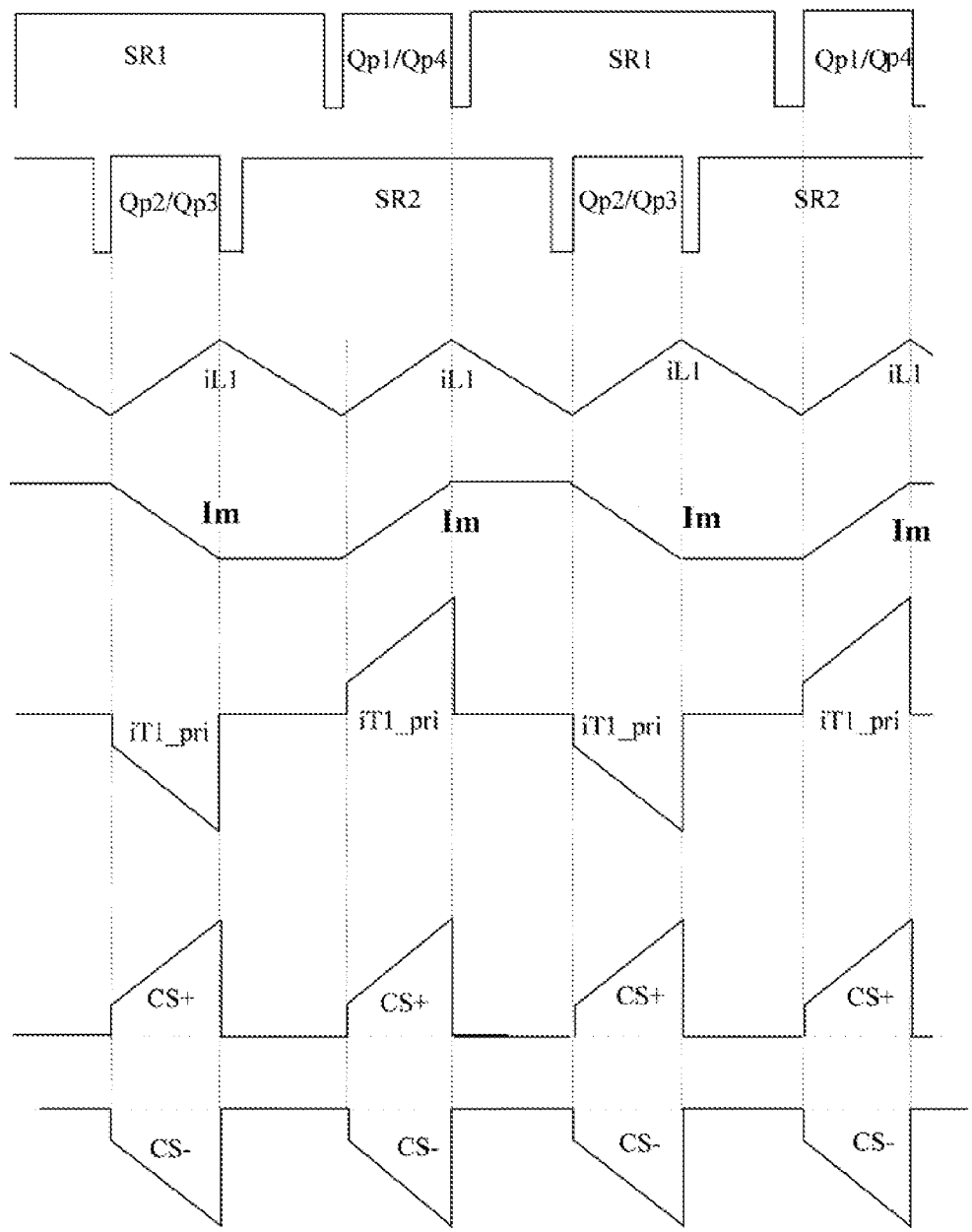
FIG. 18 illustrates a waveform diagram of relevant signals when the current detecting circuit of FIG. 16 in the first mode detects the current of the converter in FIG. 1 at the position A.

FIG. 18 illustrates waveforms of relevant signals of the converter 100 and sampling voltages outputted from the current detecting circuit 600 when the current detecting circuit 600 in the first mode is connected to the position A of the converter 100 in FIG. 1 for detecting a current.

As shown in FIG. 18, the converter 100 is positively operated, and energy is delivered from a primary side of the transformer T1 to a secondary side of the transformer T1. The switch S1 of the current detecting circuit 600 is always in an on state, and the switch S2 is always in an off state. At this time, both CS+ and CS− signals can represent waveforms of currents on the primary side of the current transformer CT. In FIG. 18, when the current iT1_pri of the transformer is 0, the sampling voltages CS+ and CS− are both Vref, when the current iT1_pri of the transformer T1 is not 0, the sampling voltage CS+ satisfies the following formula (2), and the sampling voltage CS− satisfies the following formula (3):

$$V_{CS+}=\text{Vref}+0.5\times\text{Isense}\times Rs \quad (2)$$

$$V_{CS-}=\text{Vref}-0.5\times\text{Isense}\times Rs \quad (3)$$

Figure 19:
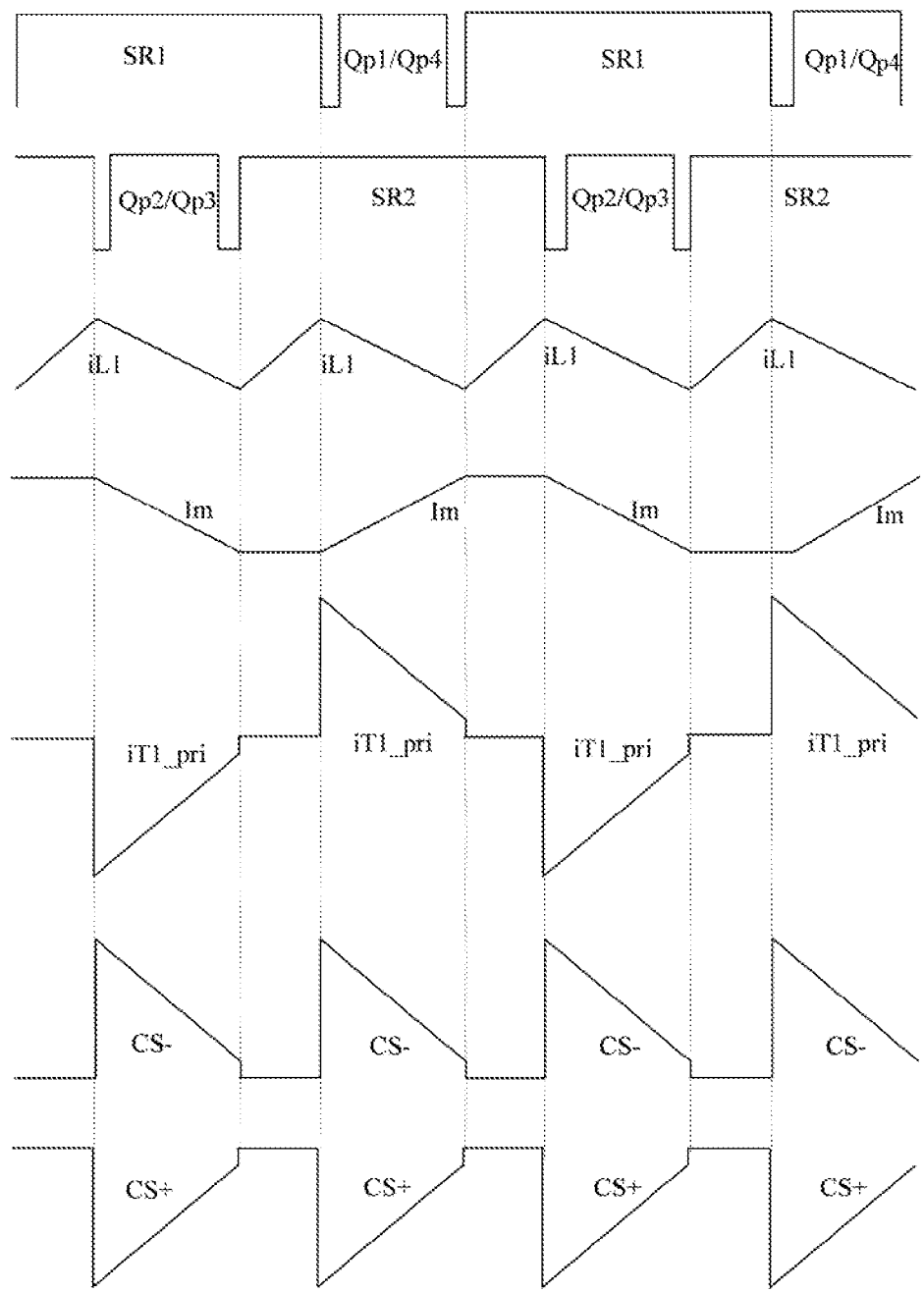
FIG. 19 illustrates a waveform diagram of relevant signals when the current detecting circuit of FIG. 17 in the second mode detects the current of the converter in FIG. 1 at the position A.

FIG. 19 illustrates waveforms of relevant signals of the converter 100 and sampling voltages outputted from the current detecting circuit 600 when the current detecting circuit 600 in the second mode is connected to the position A of the converter 100 in FIG. 1 for detecting a current.

As shown in FIG. 19, the converter 100 is reversely operated, and energy is delivered from a secondary side of the transformer T1 to a primary side of the transformer T1. The second switch S2 of the current detecting circuit 600 is controlled to be always in an on state, and the first switch S1 is controlled to be always in an off state. At this time, both sampling voltages CS+ and CS− outputted from the current detecting circuit 600 can represent a waveform of the current on the primary side of the current transformer CT. In FIG. 19, when the current iT1_pri of the transformer is 0, the sampling voltages CS+ and CS− are Vref, and when the current iT1_pri of the transformer is not 0, the sampling voltage CS+ satisfies the following formula (4), and the sampling voltage CS− satisfies the following formula (5):

$$V_{CS+}=\text{Vref}-0.5\times\text{Isense}\times Rs \quad (4)$$

$$V_{CS-}=\text{Vref}+0.5\times\text{Isense}\times Rs \quad (5)$$

Figure 20:
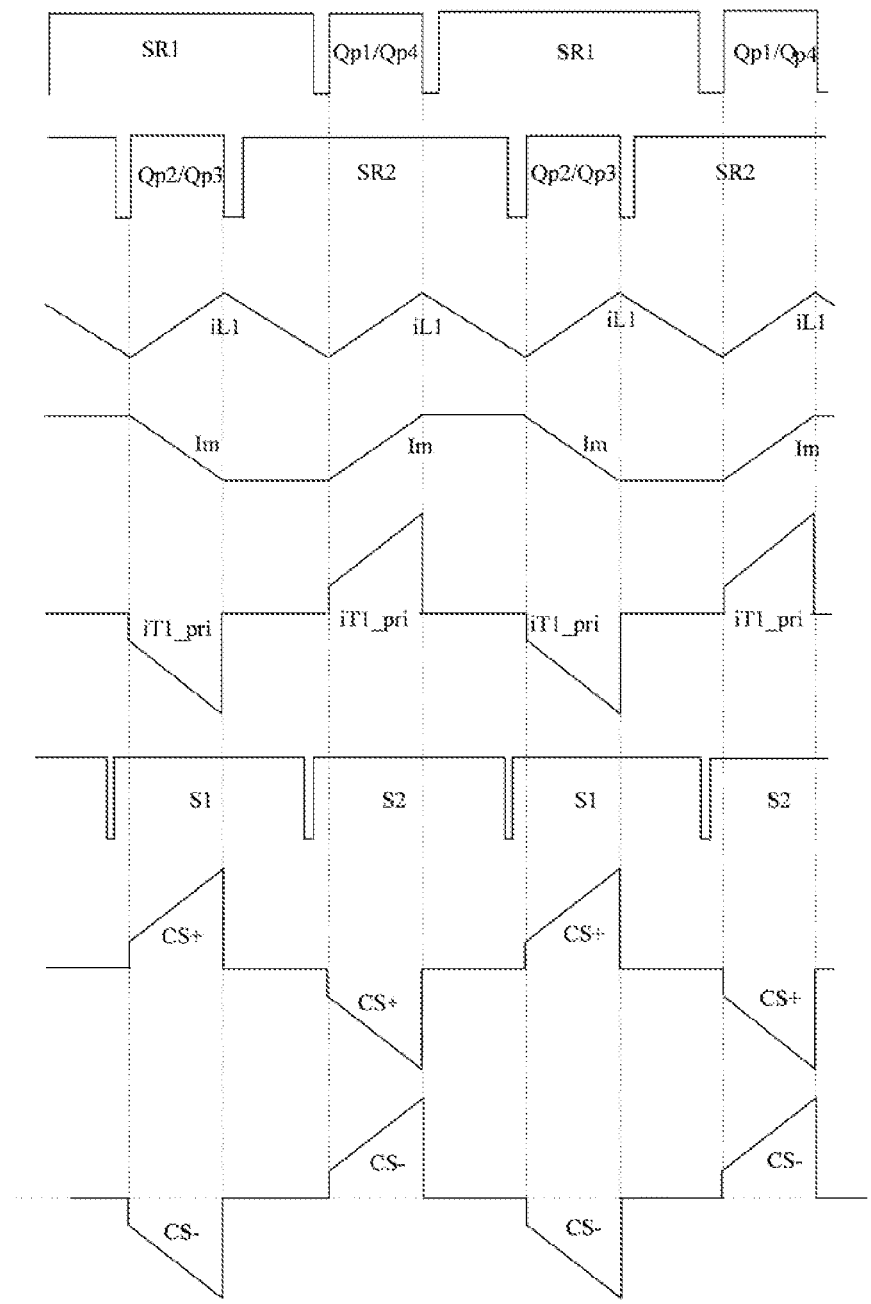
FIG. 20 illustrates a waveform diagram of relevant signals when the current detecting circuit in FIG. 15 detects the current of the converter in FIG. 1 at the position B, when the load current is large.

FIG. 20 illustrates waveforms of relevant signals of the converter 100 and sampling voltages outputted from the current detecting circuit 600 when the current detecting circuit 600 is connected to the position B of the DC/DC converter 100 in FIG. 1, if the load current is large.

As shown in FIG. 20, the converter 100 is positively operated, and energy is delivered from a primary side of the transformer to a secondary side of the transformer. Driving waveforms of the switches S1 to S2 of the current detecting circuit 600 are square wave signals, and the width of square waves is larger than or equal to that of driving signals of the switches Qp1 to Qp4 of the full bridge circuit of the converter 100. That is, if the driving signals of the switches Qp1 and Qp4 of the converter 100 are high levels, the switch S2 of the current detecting circuit 600 is also a high level. When the primary current iT1_pri of the transformer T1 of the converter 100 flows from the switch Qp1 through the transformer T1 and then to the switch Qp4, since the chip selection circuit 620 of the current detecting circuit 600 has been enabled, the sampling voltages CS+ and CS− outputted from the current detecting circuit 600 can better change follow the primary current iT1_pri of the transformer T1. The sampling voltage CS+ satisfies the following formula (6), and the sampling voltage CS− satisfies the following formula (7). If the driving signals of the switches Qp3 and Qp2 of the converter 100 are high levels, the switch S1 of the current detecting circuit 600 is also a high level. When the primary current iT1_pri of the transformer T1 of the converter 100 flows from the switch Qp3 through the transformer T1 and then to the switch Qp2, the sampling voltage CS+ satisfies the following formula (8), and the sampling voltage CS− satisfies the following formula (9):

$$V_{CS+}=\text{Vref}-0.5\times\text{Isense}\times Rs \quad (6)$$

$$V_{CS-}=\text{Vref}+0.5\times\text{Isense}\times Rs \quad (7)$$

$$V_{CS+}=\text{Vref}+0.5\times\text{Isense}\times Rs \quad (8)$$

$$V_{CS-}=\text{Vref}-0.5\times\text{Isense}\times Rs \quad (9)$$

Figure 21:
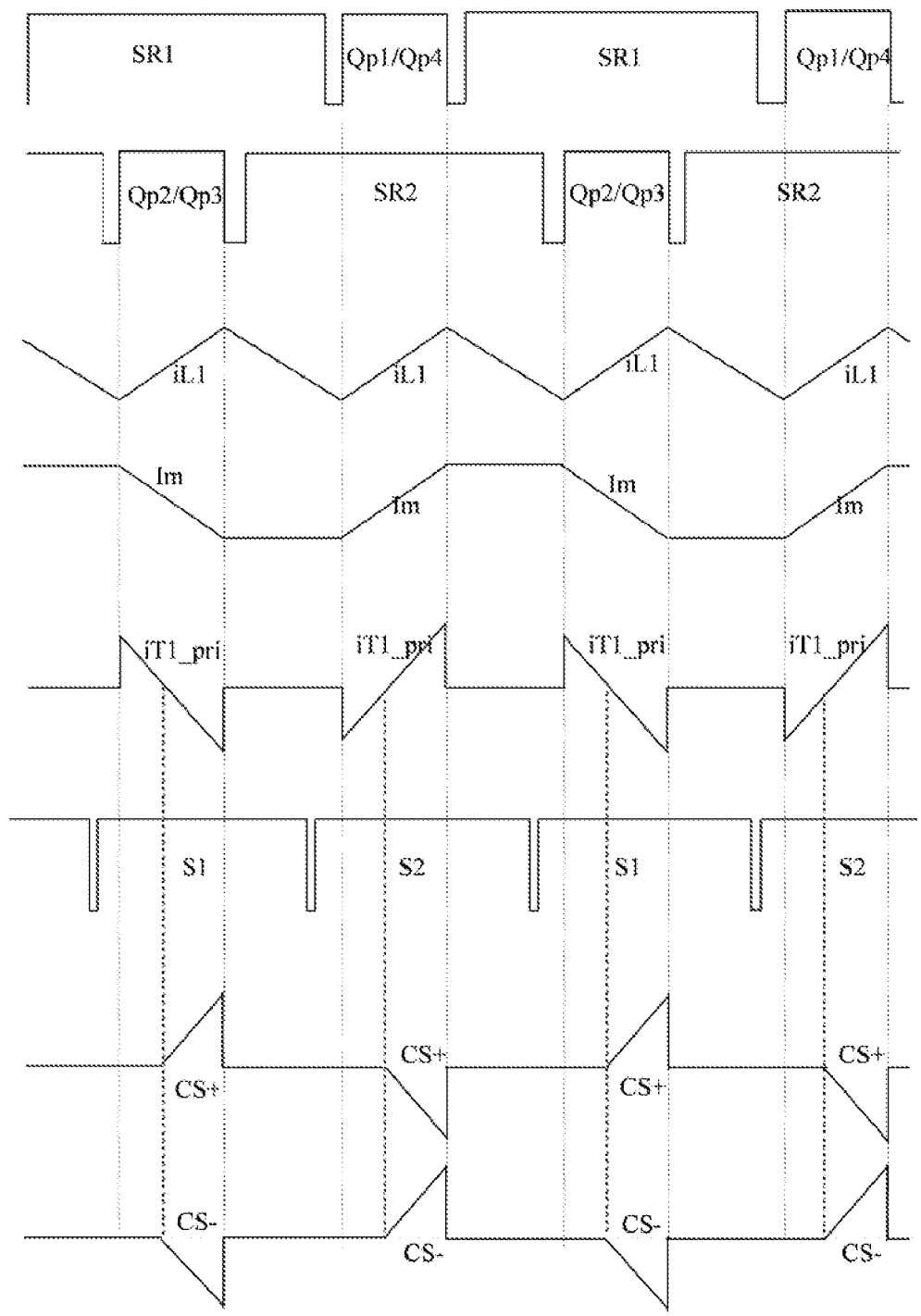
FIG. 21 illustrates a waveform diagram of relevant signals when the current detecting circuit in FIG. 15 detects the current of the converter in FIG. 1 at the position B, when the load current is small.

FIG. 21 illustrates waveforms of relevant signals of the converter 100 and sampling voltages outputted from the current detecting circuit 600 when the current detecting circuit 600 is connected to the position B of the converter 100 in FIG. 1, if the load current is small.

As shown in FIG. 21, the converter 100 is positively operated, and energy is delivered from a primary side of the transformer to a secondary side of the transformer. Driving signals of the switches S1 to S2 of the current detecting circuit 600 and driving signals of the switches Qp1 to Qp4 of the full bridge circuit of the converter 100 are consistent with that shown in FIG. 20. When the switches Qp1 and Qp4 of the converter 100 and the switch S2 of the current detecting circuit 600 are high levels, after the primary current iT1_pri of the transformer T1 of the converter 100 passing 0 A from the negative minimum value, the sampling voltage CS+ outputted from the current detecting circuit 600 satisfies the formula (10), and the sampling voltage CS− satisfies the formula (11). When the switches Qp2 and Qp3 of the DC/DC converter 100 and the switch S1 of the current detecting circuit 600 are high levels, after the primary current iT1_pri of the transformer T1 of the converter 100 passing 0 A from the positive maximum value, the sampling voltage CS+ outputted from the current detecting circuit 600 satisfies the formula (12), and the sampling voltage CS− satisfies the formula (13).

$$V_{CS+}=\text{Vref}-0.5\times\text{Isense}\times Rs \quad (10)$$

$$V_{CS-}=\text{Vref}+0.5\times\text{Isense}\times Rs \quad (11)$$

$$V_{CS+}=\text{Vref}+0.5\times\text{Isense}\times Rs \quad (12)$$

$$V_{CS-}=\text{Vref}-0.5\times\text{Isense}\times Rs \quad (13)$$

FIG. 22 illustrates a current detecting method according to one embodiment of the application. For example, the method can use the current detecting method according to any embodiment of the application to detect the current at the position A or B of the converter 100 in FIG. 1.

As shown in FIG. 22, in step S102, a current to be detected is received from a primary winding of the current transformer, and a sampling current is produced on a secondary winding of the current transformer. The current to be detected as received from the primary winding of the current transformer can flow through the primary winding of the current transformer in two flow directions, and the sampling current flowing out of the secondary winding of the current transformer is a vector sum of a secondary current induced by the secondary winding of the current transformer and a magnetizing current of the current transformer. In step S104, the sampling current flows through a chip selection circuit. The chip selection circuit is operably switched between a first mode and a second mode. When the current to be detected flows through the primary winding of the current transformer in a first direction, the chip selection circuit may be switched to the first mode, and when the current to be detected flows through the primary winding of the current transformer in a second direction opposite to the first direction, the chip selection circuit may be switched to the second mode. In step S106, the sampling current is sampled by a sampling circuit electrically connected to the chip selection circuit, and a sampling signal is outputted to a controller. For example, the sampling signal is outputted to two A/D input ports of the digital signal processor. For example, the sampling circuit includes a sampling resistor, and when the sampling currents in different directions flow through the sampling resistor, two sampling voltages may be obtained at both ends of the sampling resistor.

Optionally, the method can clamp the sampling circuit to a reference potential by a clamping circuit, such that a common-mode voltages of the two sampling voltages produced at the sampling resistor relative to secondary grounds are predictable and non-floating values, and the sampling voltages are within a voltage range of the A/D input ports of the digital signal processor.

Optionally, the current detecting method also can comprise step S108, demagnetizing the current transformer by a demagnetizing circuit. The demagnetizing circuit can comprise a demagnetizing resistor, and when the primary current of the current transformer is reduced to 0, energy in a magnetizing inductance of the current transformer can be consumed by the demagnetizing resistor to function as a demagnetizing current transformer.

In conclusion, the application provides a current detecting circuit, which realizes capability of bidirectional current detection by a controllable chip selection circuit, and compared with the bidirectional current detecting circuit in the prior art, when the converter has the requirement for bidirectional energy transmission, the detection results obtained by the current detecting circuit provided in the application still can support a peak current control.

It shall be noticed that the above-mentioned descriptions are only preferable embodiments provided for explaining the application, but the application is not limited thereto, and the scope protected by the application is determined by the appended claims. Moreover, those skilled in the art may make further modifications to the embodiments of the application, but these modifications fall into the scope protected by the appended claims.

What is claimed is:

1. A current detecting circuit, comprising:
    a current transformer having a primary winding for receiving a current to be detected and a secondary winding for generating a sampling current;
    a demagnetizing circuit having both ends electrically connected to the secondary winding of the current transformer to demagnetize the current transformer;
    a chip selection circuit electrically connected to the demagnetizing circuit, and operably switched between a first mode and a second mode, wherein the first mode is configured to detect the current to be detected in a first direction, and the second mode is configured to detect the current to be detected in a second direction opposite to the first direction;
    a sampling circuit electrically connected to the chip selection circuit to sample the sampling current, and outputting a sampling signal to a controller; and
    a clamping circuit electrically connected between the sampling circuit and the controller, and configured to provide a reference potential.

2. The current detecting circuit according to claim 1, wherein the demagnetizing circuit comprises a demagnetizing resistor and a voltage clamping branch, the demagnetizing resistor and the voltage clamping branch are connected in parallel between both ends of the secondary winding.

3. The current detecting circuit according to claim 2, wherein the voltage clamping branch comprises a first clamping diode and a second clamping diode, and the first clamping diode and the second clamping diode are connected in series reversely.

4. The current detecting circuit according to claim 1, wherein
    the chip selection circuit has a first input end, a second input end, a first output end and a second output end, and comprises a first branch electrically connected between the first input end and the first output end, and a second branch electrically connected between the second input end and the second output end,
    when the chip selection circuit is in the first mode, a current flows through the first branch, the sampling circuit and the second branch sequentially, and
    when the chip selection circuit is in the second mode, a current flows through the second branch, the sampling circuit and the first branch sequentially.

5. The current detecting circuit according to claim 4, wherein
    the first branch comprises a first switch and a first diode connected in parallel, the second branch comprises a second switch and a second diode connected in parallel, the anodes of the first diode and the second diode are electrically connected to the first output end and the second output end respectively, and the cathodes of the first diode and the second diode are electrically connected to the first input end and the second input end respectively,
    when the chip selection circuit is in the first mode, the first switch and the second diode are turned on, the second switch is turned off, and the first diode is cut off, and
    when the chip selection circuit is in the second mode, the second switch and the first diode are turned on, the first switch is turned off, and the second diode is cut off.

6. The current detecting circuit according to claim 5, wherein
    the first switch and the second switch are N-channel MOSFETs, and
    the first diode and the second diode are parasitic diodes of the first switch and the second switch respectively, or the first diode and the second diode are Schottky diodes.

7. The current detecting circuit according to claim 4, wherein the sampling circuit has a first sampling end electrically connected to the first output end of the chip selection circuit and a second sampling end electrically connected to the second output end of the chip selection circuit, and comprises a sampling resistor and a sampling capacitor connected in parallel between the first sampling end and the second sampling end.

8. The current detecting circuit according to claim 7, wherein
the clamping circuit comprises a first filter capacitor, a second filter capacitor, a third switch and a fourth switch,
the first filter capacitor and the fourth switch connected in parallel are electrically connected between the first sampling end and a clamping node clamped to the reference potential, and the second filter capacitor and the third switch connected in parallel are electrically connected between the clamping node and the second sampling end,
when the chip selection circuit is in the first mode, the third switch is turned on, and the fourth switch is turned off, and
when the chip selection circuit is in the second mode, the fourth switch is turned on, and the third switch is turned off.

9. The current detecting circuit according to claim 7, wherein
the sampling capacitor is formed by a first sampling capacitor and a second sampling capacitor connected in series, and
the clamping circuit is configured to clamp a junction node formed by connecting the first sampling capacitor and the second sampling capacitor in series to the reference potential.

10. A converter, comprising a DC capacitor and a switch circuit, wherein
the converter further comprises the current detecting circuit according to claim 1, and the primary winding of the current transformer of the current detecting circuit receives a current between the DC capacitor and the switch circuit.

11. A converter, comprising a transformer, a primary circuit at a primary side of the transformer and a secondary circuit at a secondary side of the transformer, wherein
the converter further comprises the current detecting circuit according to claim 1 and the primary winding of the current transformer of the current detecting circuit receives a current through the primary winding of the transformer.

12. A current detecting method, comprising:
receiving a current to be detected from a primary winding of a current transformer, and generating a sampling current on a secondary winding of the current transformer;
flowing the sampling current through a chip selection circuit; and
sampling the sampling current and outputting a sampling signal to a controller using a sampling circuit electrically connected to the chip selection circuit, wherein
when the current to be detected flows in a first direction, the chip selection circuit is set to a first mode, and when the current to be detected flows in a second direction opposite to the first direction, the chip selection circuit is set to a second mode, and
the sampling circuit is clamped to a reference potential through a clamping circuit.

13. The current detecting method according to claim 12, further comprising:

demagnetizing the current transformer using a demagnetizing circuit.

14. The current detecting method according to claim 13, wherein
the demagnetizing circuit comprises a demagnetizing resistor and a voltage clamping branch, the demagnetizing resistor and the voltage clamping branch are connected in parallel to both ends of the secondary winding of the current transformer, and
the voltage clamping branch comprises a first clamping diode and a second clamping diode, and the first clamping diode and the second clamping diode are connected in series reversely.

15. The current detecting method according to claim 12, wherein
the chip selection circuit has a first input end, a second input end, a first output end and a second output end, and comprises a first branch electrically connected between the first input end and the first output end and a second branch electrically connected between the second input end and the second output end, and the first input end and the second input end are electrically connected to both ends of the secondary winding of the current transformer respectively,
when the chip selection circuit is in the first mode, a current flows through the first branch, the sampling circuit and the second branch sequentially, and
when the chip selection circuit is in the second mode, a current flows through the second branch, the sampling circuit and the first branch sequentially.

16. The current detecting method according to claim 15, wherein
the first branch comprises a first switch and a first diode connected in parallel, the second branch comprises a second switch and a second diode connected in parallel, the anodes of the first diode and the second diode are electrically connected to the first output end and the second output end respectively, and the cathodes of the first diode and the second diode are electrically connected to the first input end and the second input end respectively,
when the chip selection circuit is in the first mode, the first switch and the second diode are turned on, the second switch is turned off, and the first diode is cut off, and
when the chip selection circuit is in the second mode, the second switch and the first diode are turned on, the first switch is turned off, and the second diode is cut off.

17. The current detecting method according to claim 16, wherein
the first switch and the second switch are N-channel MOSFETs, and
the first diode and the second diode are parasitic diodes of the first switch and the second switch respectively, or the first diode and the second diode are Schottky diodes.

18. The current detecting method according to claim 15, wherein
the sampling circuit has a first sampling end electrically connected to the first output end of the chip selection circuit and a second sampling end electrically connected to the second output end of the chip selection circuit, and comprises a sampling resistor and a sampling capacitor connected in parallel between the first sampling end and the second sampling end.

19. The current detecting method according to claim 18, wherein the clamping circuit comprises a first filter capacitor, a second filter capacitor, a third switch and a fourth switch, the first filter capacitor and the fourth switch connected in parallel are electrically connected between the first sampling end and a clamping node clamped to the reference potential, and the second filter capacitor and the third switch connected in parallel are electrically connected between the clamping node and the second sampling end, when the chip selection circuit is in the first mode, the third switch is turned on, and the fourth switch is turned off, and when the chip selection circuit is in the second mode, the fourth switch is turned on, and the third switch is turned off.

20. The current detecting method according to claim 18, wherein the sampling capacitor is formed by a first sampling capacitor and a second sampling capacitor connected in series, and the clamping circuit is configured to clamp a junction node formed by connecting the first sampling capacitor and the second sampling capacitor in series to the reference potential.

* * * * *